United States Patent
Richt

(10) Patent No.: US 10,319,050 B2
(45) Date of Patent: Jun. 11, 2019

(54) SYSTEMS FOR ADJUSTING AGRONOMIC INPUTS USING REMOTE SENSING, AND RELATED APPARATUS AND METHODS

(71) Applicant: CiBO Technologies, Inc., Cambridge, MA (US)

(72) Inventor: Ryan Richt, St. Louis, MO (US)

(73) Assignee: CiBO Technologies, Inc., Cambridge, MA (US)

( * ) Notice: Subject to any disclaimer, the term of this patent is extended or adjusted under 35 U.S.C. 154(b) by 0 days.

(21) Appl. No.: 15/701,347

(22) Filed: Sep. 11, 2017

(65) Prior Publication Data

US 2018/0075545 A1 Mar. 15, 2018

Related U.S. Application Data

(60) Provisional application No. 62/385,952, filed on Sep. 9, 2016.

(51) Int. Cl.
| | |
|---|---|
| *G06K 9/00* | (2006.01) |
| *G06Q 50/02* | (2012.01) |
| *G06F 17/50* | (2006.01) |
| *G06T 11/20* | (2006.01) |
| *G06Q 10/06* | (2012.01) |

(52) U.S. Cl.
CPC ......... *G06Q 50/02* (2013.01); *G06F 17/5009* (2013.01); *G06K 9/00657* (2013.01); *G06Q 10/063* (2013.01); *G06Q 10/067* (2013.01); *G06T 11/206* (2013.01); *G06T 2207/10032* (2013.01); *G06T 2207/30188* (2013.01)

(58) Field of Classification Search
None
See application file for complete search history.

(56) References Cited

U.S. PATENT DOCUMENTS

| | | |
|---|---|---|
| 6,999,877 B1 | 2/2006 | Dyer et al. |
| 7,184,892 B1 | 2/2007 | Dyer et al. |
| 8,078,367 B2 | 12/2011 | Sauder et al. |
| 9,009,087 B1 | 4/2015 | Mewes et al. |
| 9,202,252 B1 | 12/2015 | Smith et al. |
| 9,322,629 B2 | 4/2016 | Sauder et al. |
| 9,519,861 B1 | 12/2016 | Gates et al. |
| 9,881,214 B1 | 1/2018 | Zhong et al. |
| 10,028,451 B2 | 7/2018 | Rowan et al. |
| 2001/0016053 A1 | 8/2001 | Dickson et al. |
| 2002/0103688 A1 | 8/2002 | Schneider |
| 2003/0018431 A1 | 1/2003 | Hanson |

(Continued)

FOREIGN PATENT DOCUMENTS

| | | |
|---|---|---|
| CA | 2663917 A1 | 10/2010 |
| WO | WO-2015/051339 A1 | 4/2015 |
| WO | WO-2018/081043 A1 | 5/2018 |

OTHER PUBLICATIONS

Int'l Search Report and Written Opinion of the ISA/EP in PCT/US2017/043623; Sep. 4, 2017; 8 pgs.

(Continued)

*Primary Examiner* — Wei Wen Yang
(74) *Attorney, Agent, or Firm* — Goodwin Procter LLP

(57) ABSTRACT

Methods, systems, and apparatus, including computer programs encoded on computer storage media for using remote sensing data to infer agronomic inputs to an agronomic simulation model.

29 Claims, 6 Drawing Sheets

(56) References Cited

U.S. PATENT DOCUMENTS

| | | |
|---|---|---|
| 2005/0096849 A1 | 5/2005 | Sorrells |
| 2005/0234753 A1 | 10/2005 | Pinto et al. |
| 2006/0015374 A1 | 1/2006 | Ochs et al. |
| 2006/0287896 A1 | 12/2006 | McComb |
| 2007/0174095 A1 | 7/2007 | McComb |
| 2007/0255502 A1 | 11/2007 | Pruett et al. |
| 2009/0203526 A1 | 8/2009 | Haikal et al. |
| 2009/0234695 A1 | 9/2009 | Kapadi et al. |
| 2010/0241590 A1 | 9/2010 | Moore |
| 2010/0306012 A1 | 12/2010 | Zyskowski et al. |
| 2011/0047867 A1* | 3/2011 | Holland .............. G01J 3/10 47/1.5 |
| 2012/0083907 A1 | 4/2012 | Motavalli et al. |
| 2012/0101634 A1 | 4/2012 | Lindores |
| 2012/0101861 A1 | 4/2012 | Lindores |
| 2012/0109614 A1 | 5/2012 | Lindores |
| 2012/0226517 A1 | 9/2012 | Sitaram |
| 2013/0139277 A1 | 5/2013 | Tierney |
| 2013/0174040 A1 | 7/2013 | Johnson |
| 2013/0198693 A1 | 8/2013 | Jost et al. |
| 2013/0332205 A1* | 12/2013 | Friedberg .............. G06Q 40/08 705/4 |
| 2014/0012732 A1 | 1/2014 | Lindores |
| 2014/0129146 A1 | 5/2014 | Romier |
| 2014/0278731 A1 | 9/2014 | Griffin et al. |
| 2014/0358486 A1 | 12/2014 | Osborne |
| 2015/0201605 A1 | 7/2015 | Groeneveld |
| 2015/0278640 A1 | 10/2015 | Johnson et al. |
| 2015/0302305 A1 | 10/2015 | Rupp et al. |
| 2015/0370935 A1 | 12/2015 | Starr |
| 2016/0003792 A1 | 1/2016 | Owens et al. |
| 2016/0018380 A1 | 1/2016 | Gerber-Siff et al. |
| 2016/0050840 A1 | 2/2016 | Sauder et al. |
| 2016/0066505 A1 | 3/2016 | Bakke et al. |
| 2016/0071223 A1 | 3/2016 | Rupp et al. |
| 2016/0071410 A1 | 3/2016 | Rupp et al. |
| 2016/0073573 A1 | 3/2016 | Ethington et al. |
| 2016/0078375 A1 | 3/2016 | Ethington et al. |
| 2016/0078569 A1 | 3/2016 | Ethington et al. |
| 2016/0078570 A1 | 3/2016 | Ethington et al. |
| 2016/0110812 A1 | 4/2016 | Mun |
| 2016/0125331 A1 | 5/2016 | Vollmar et al. |
| 2016/0180473 A1 | 6/2016 | Groeneveld |
| 2016/0202227 A1 | 7/2016 | Mathur et al. |
| 2016/0215994 A1 | 7/2016 | Mewes et al. |
| 2016/0223511 A1 | 8/2016 | Koshnick et al. |
| 2016/0232621 A1 | 8/2016 | Ethington et al. |
| 2016/0239709 A1 | 8/2016 | Shriver |
| 2016/0247075 A1 | 8/2016 | Mewes et al. |
| 2016/0247082 A1 | 8/2016 | Stehling et al. |
| 2016/0259089 A1 | 9/2016 | McKinnon et al. |
| 2016/0275580 A1 | 9/2016 | Uechi |
| 2016/0290918 A1 | 10/2016 | Xu et al. |
| 2016/0302351 A1 | 10/2016 | Schildroth et al. |
| 2016/0308954 A1 | 10/2016 | Wilbur et al. |
| 2017/0061052 A1 | 3/2017 | Gates et al. |
| 2017/0075034 A1 | 3/2017 | Kleeman et al. |
| 2017/0083747 A1* | 3/2017 | Guan .............. G06K 9/0063 |
| 2017/0105335 A1 | 4/2017 | Xu et al. |
| 2017/0109395 A1 | 4/2017 | Farah |
| 2017/0124463 A1 | 5/2017 | Chen et al. |
| 2017/0161584 A1 | 6/2017 | Guan et al. |
| 2017/0161627 A1 | 6/2017 | Xu et al. |
| 2017/0168157 A1 | 6/2017 | Hagerman et al. |
| 2017/0169523 A1 | 6/2017 | Xu et al. |
| 2017/0196171 A1 | 7/2017 | Xu et al. |
| 2017/0213141 A1 | 7/2017 | Xu et al. |
| 2017/0228475 A1 | 8/2017 | Aldor-Noiman et al. |
| 2017/0261645 A1 | 9/2017 | Kleeman et al. |
| 2017/0270616 A1* | 9/2017 | Basso .............. G06Q 40/08 |
| 2017/0300602 A1 | 10/2017 | Leeds et al. |
| 2017/0316124 A1 | 11/2017 | Lee |
| 2017/0323426 A1 | 11/2017 | Johannesson |
| 2017/0329048 A1 | 11/2017 | Lemos et al. |
| 2017/0336533 A1 | 11/2017 | Alvarez et al. |
| 2017/0351005 A1 | 12/2017 | Alvarez et al. |
| 2017/0351790 A1 | 12/2017 | Farah et al. |
| 2017/0351963 A1 | 12/2017 | Leeds et al. |
| 2017/0357029 A1 | 12/2017 | Lakshmanan |
| 2018/0020622 A1 | 1/2018 | Richt |
| 2018/0024271 A1 | 1/2018 | Koch et al. |
| 2018/0035605 A1 | 2/2018 | Guan et al. |
| 2018/0042174 A1 | 2/2018 | Li et al. |
| 2018/0046735 A1 | 2/2018 | Xu et al. |
| 2018/0060975 A1 | 3/2018 | Hassanzadeh |
| 2018/0070527 A1 | 3/2018 | Richt |
| 2018/0075545 A1 | 3/2018 | Richt |
| 2018/0075546 A1 | 3/2018 | Richt |
| 2018/0108123 A1 | 4/2018 | Baurer et al. |
| 2018/0128933 A1 | 5/2018 | Koch et al. |
| 2018/0132422 A1 | 5/2018 | Hassanzadeh et al. |
| 2018/0146612 A1 | 5/2018 | Sauder et al. |
| 2018/0146624 A1 | 5/2018 | Chen et al. |
| 2018/0168094 A1 | 6/2018 | Koch et al. |
| 2018/0181893 A1 | 6/2018 | Basso |
| 2018/0211156 A1 | 7/2018 | Guan et al. |
| 2018/0260504 A1 | 9/2018 | Hu |

OTHER PUBLICATIONS

Int'l Search Report and Written Opinion of the ISA/EP in PCT/US2017/050858; Dec. 8, 2017; 10 pgs.

Int'l Search Report and Written Opinion of the ISA/EP in PCT/US2017/050859; Nov. 22, 2017; 9 pgs.

Basso et al. Review of Crop Yield Forecasting Methods and Early Warning Systems. Michigan State University, 2013 (56 pages). Available at <http://www.fao.orq/fileadmin/templates/ess/documents/meetings_and_workshops/GS_SAC_2013/Improving_methods_for_crops_estimates/Crop_Yield_Forcasting_Methods_and_Early_Warning_Systems_Lit_review.pdf>, last accessed Jan. 22, 2019.

Basso, B., et al., "A Strategic and Tactical Management Approach to Select Optimal n. Fertilizer Rates for Wheat in a Spatially Variable Field," Europ. J. Agronomy, 35:215-22 (2011).

Basso, B., et al., "Analyzing the Effects of Climate Variability on Spatial Pattern of Yield in a Maize-Wheat-Soybean Rotation," Europ. J. Agronomy, 26:82-91 (2007).

Basso, B., et al., "Assessing the Impact of Management Strategies on Water Use Efficiency Using Soil-Plant-Atmosphere Models," Vadose Zone J., available from www.VadoseZoneJournal.org (2012); 9 pp.

Basso, B., et al., "Economic and Environmental Evaluation of Site-Specific Tillage in a Maize Crop in Ne Italy," Europ. J. Agronomy, 35:83-92 (2011).

Basso, B., et al., "Environmental and Economic Evaluation of n. Fertilizer Rates in a Maize Crop in Italy: a Spatial and Temporal Analysis Using Crop Models," Biosystems Engineering, 113:103-11 (2012).

Basso, B., et al., "Landscape Position and Precipitation Effects on Spatial Variability of Wheat Yield and Grain Protein in Southern Italy," J. Agronomy & Crop Science, 195:301-12 (2009).

Basso, B., et al., "Long-Term Wheat Response to Nitrogen in a Rainfed Mediterranean Environment: Field Data and Simulation Analysis," Europ. J. Agronomy, 33:132-38 (2010).

Basso, B., et al., "Spatial Validation of Crop Models for Precision Agriculture," Agricultural Systems, 68:97-112 (2001).

Batchelor, William D., et al., "Examples of Strategies to Analyze Spatial and Temporal Yield Variability Using Crop Models," Europ. J. Aoronomy, 18:141-58 (2002).

Benson, E. R., J. F. Reid, and Qinglin Zhang. "Machine vision-based guidance system for an agricultural small-grain harvester." Transactions of the ASAE 46.4 (2003): 1255-1264.

Cammarano, D., et al., "Assessing the Robustness of Vegetation Indices to Estimate Wheat N. In Mediterranean Environments," Remote Sens., 6:2827-44 (2014).

Cammarano, D., et al., "Use of the Canopy Chlorophyl Content Index (CCCI) for Remote Estimation of Wheat Nitrogen Content in Rainfed Environments," Agronomy Journal, 103(6):1597-1603 (2011).

(56) References Cited

OTHER PUBLICATIONS

Chang, Young K., et al. "An automated yield monitoring system II for commercial wild blueberry double-head harvester." Computers and electronics in agriculture 81 (2012): 97-103.
Dumont et al. Parameter Identification of the Stics Crop Model, Using an Accelerated Formal MCMC Approach. Journal of Environmental Modeling and Software, vol. 52 (Feb. 2014), 42 pages.
Filimon E., "Weather to Buy or Sell Extreme Weather Impact on Corn Futures Market," Master's Thesis, pp. 1-74 (2011).
Int'l Search Report and Written Opinion of the ISA/EP in PCT/US2017/050860; Dec. 19, 2017; 12 pgs.
International Application No. PCT/US2016031826; International Preliminary Report on Patentability, dated Nov. 14, 2017; 11 pages.
International Application No. PCT/US2016031826; International Search Report and Written Opinion, dated Aug. 18, 2018; 13 pages.
International Search Report and Written Opinion of the International Searching Authority in counterpart International Application No. PCT/US2015/063910, dated Feb. 5, 2016 (17 pages).
Jones, J.W., et al., "The DSSAT Cropping System Model," Europ. J. Agronomy, 18:235-65 (2003).
Nuske, Stephen, et al. "Automated visual yield estimation in vineyards." Journal of Field Robotics 31.5 (2014): 837-860.
Ritchie, J.T., et al., "Water Use Efficiency is Not Constant When Crop Water Supply is Adequate or Fixed: The Role of Agronomic Management," Europ. J. Agronomy, 28:273-81 (2008).
Rosenzweig et al. The Agricultural Model Intercomparison and Improvement Project (AgMIP): Protocols and pilot studies. Journal of Agricultural and Forest Meteorology, vol. 170 (Mar. 15, 2013), pp. 166-182.
Yield Editor 2.0, United States Department of Agriculture, Agricultural Research Service, Version 2.01 (Sep. 29, 2012), 28 pages.
Int'l Search Report and Written Opinion of the ISA/US in PCT/US2017/57974; Feb. 13, 2018; 13 pgs.

* cited by examiner

SYSTEMS FOR ADJUSTING AGRONOMIC INPUTS USING REMOTE SENSING, AND RELATED APPARATUS AND METHODS

CROSS-REFERENCE TO RELATED APPLICATION(S)

This application claims priority to and the benefit of U.S. Provisional Patent Application Ser. No. 62/385,952, filed on Sep. 9, 2016, which is hereby incorporated by reference herein to the maximum extent permitted by applicable law.

TECHNICAL FIELD

This specification is directed towards systems and methods for agronomic simulation based on analysis of remotely sensed agricultural data.

BACKGROUND

Agronomy is the science and technology of producing and/or using plants (e.g., for food, fuel, fiber, land reclamation, etc.). Agronomy encompasses work in the areas of plant genetics, plant physiology, meteorology, soil science, etc. An agronomic simulation model can be used to predict the agronomic output of a particular geographic region based on a set of agronomic inputs. The predictions output by an agronomic simulation model may be limited by the accuracy of the set of input data provided to the agronomic simulation model and the parameters used to configure the agronomic simulation model.

SUMMARY

The agronomic output (e.g., crop yield) of a geographic region (e.g., field or farmable zone) may be influenced by the agronomic parameters (e.g., agricultural characteristics) of the field. Agricultural characteristics may include, for example, biotic factors and non-biotic factors. Agronomic simulators are sometimes used to predict the agronomic output of a geographic region based on the agronomic inputs to the region. For example, agronomic simulators may be used to predict the crop yield for a field, or to predict the effect of an agronomic intervention on the crop yield for a field.

In some instances, the agronomic inputs provided to an agronomic simulator may omit or mischaracterize the values of one or more agronomic parameters of a geographic region, and the failure to provide accurate values for the agronomic parameters as inputs to the agronomic simulator may have an adverse impact on the simulator's predictions of the geographic region's agronomic outputs (e.g., crop yield). Thus, techniques are needed for determining when the agronomic inputs to an agronomic simulator are incomplete or incorrect, and for inferring the existence and/or values of agronomic inputs that can be used to improve the predictions made by the agronomic simulator. Such techniques are described herein.

In general, one innovative aspect of the subject matter described in this specification can be embodied in a method including: identifying, based on data from an agronomic simulation model, a first indication of existence of a first agricultural characteristic in a particular portion of a first geographic region; receiving remote sensing data associated with the first geographic region, the received remote sensing data having been obtained using one or more remote sensing devices; identifying, based on the received remote sensing data, a second indication of existence of a second agricultural characteristic in the particular portion of the first geographic region; determining that the second indication is distinct from the first indication; and in response to determining that the second indication is distinct from the first indication, inferring one or more inputs to the agronomic simulation model based on the received remote sensing data to account for the existence of the second agricultural characteristic as indicated by the second indication.

Other embodiments of this aspect include corresponding computer systems, apparatus, and computer programs recorded on one or more computer storage devices, each configured to perform the actions of the methods. A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

The foregoing and other embodiments can each optionally include one or more of the following features, alone or in combination. The actions of the method may include identifying, based on second data from an agronomic simulation model, a third indication of existence of a third agricultural characteristic in a particular portion of a second geographic region; receiving second remote sensing data associated with the second geographic region, the received second remote sensing data having been obtained using one or more remote sensing devices; identifying, based on the received second remote sensing data, a fourth indication of existence of a fourth agricultural characteristic in the particular portion of the second geographic region; determining that the fourth indication is substantially in accordance with the third indication; and based on determining that the fourth indication is substantially in accordance with the third indication, confirming a validity of the third indication of the existence of the third agricultural characteristic.

Determining that the fourth indication is substantially in accordance with the third indication may include determining that the fourth indication substantially matches the third indication within a threshold amount of consistency. The first agricultural characteristic may be indicative of pollination, evapotranspiration and/or tasseling. The remote sensing data may include infrared measurements, thermal measurements, visible light measurements, near-infrared measurements, measurements of ultraviolet light and other forms of electromagnetic radiation, and/or aerially collected remote sensing data.

Identifying, based on data from the agronomic simulation model, a first indication of the existence of a first agricultural characteristic in a particular portion of a first geographic region may include: providing geographic data, other than the received remote sensing data, that identifies the particular portion of the first geographic region to an agronomic simulation model; and receiving an output from the agronomic simulation model that includes data identifying one or more agricultural characteristics that the agronomic simulation model predicts as existing within the particular portion of the first geographic region. The one or more agricultural characteristics may be predicted by the agronomic simulation model based on an evaluation of rainfall, soil hydraulic conductivity, and elevation.

Receiving remote sensing data associated with the first geographic region may include receiving data indicative of one or more images of the first geographic region, the images having been captured by one or more cameras. Identifying, based on the received remote sensing data, a second indication of the existence of the second agricultural characteristic in the particular portion of the first geographic region may include analyzing the one or more images of the first geographic region to determine whether the one or more images include an indication of the existence of the second agricultural characteristic. The second agricultural characteristic may include ponding of water, tasseling and/or canopy growth. The one or more remote sensing devices may include a camera. Each of the one or more remote sensing devices may be coupled to a respective plane, drone, or satellite.

Inferring the one or more inputs may include adjusting one or more parameters of an agronomic simulation model to account for the existence of the second agricultural characteristic as indicated by the second indication. Inferring the one or more inputs may further include adjusting a set of agronomic inputs to the agronomic simulation model to account for the existence of the second agricultural characteristic as indicated by the second indication.

Determining that the second indication is distinct from the first indication may include determining that the second indication based on the remote sensing data identifies at least one agronomic characteristic that is not modeled by the agronomic simulation model. The actions of the method may include updating the agronomic simulation model to model the identified at least one agronomic characteristic.

The first indication of the existence of a first agricultural characteristic in a particular portion of a first geographic region may include data indicating the non-existence of the first agricultural characteristic. The second indication of the existence of a second agricultural characteristic in the particular portion of the first geographic region may include data indicating the existence of the first agricultural characteristic.

In general, another innovative aspect of the subject matter described in this specification can be embodied in a method for using remote sensing data to infer one or more inputs to an agronomic simulation model, the method including: receiving remote sensing data associated with a first geographic region, the received remote sensing data having been obtained using one or more remote sensing devices; determining, based on the received remote sensing data, that one or more portions of the first geographic region are associated with a particular agricultural characteristic; determining whether the particular agricultural characteristic is produced by one or more biotic factors; and in response to determining that the particular agricultural characteristic is produced by the one or more biotic factors, inferring one or more inputs to the agronomic simulation model to account for the one or more biotic factors.

Other embodiments of this aspect include corresponding computer systems, apparatus, and computer programs recorded on one or more computer storage devices, each configured to perform the actions of the methods. A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

The foregoing and other embodiments can each optionally include one or more of the following features, alone or in combination. The actions of the method may include: for the particular agricultural characteristic, calculating, by the agronomic simulation model, another agricultural characteristic, with the particular agricultural characteristic being attributable to the other agricultural characteristic. Calculating the other agricultural characteristic may include back-calculating the other agricultural characteristic. The particular agricultural characteristic may include an emergence date, and the other agricultural characteristic may include a planting date. The particular agricultural characteristic may be indicative of ponding, and the other agricultural characteristic may be indicative of soil hydraulic conductivity.

The particular agricultural characteristic may be indicative of pollination, tasseling, evapotranspiration, a canopy, and/or a plant stand count. Receiving remote sensing data associated with the first geographic region may include receiving data indicative of one or more color images of the first geographic region, the color images having been captured by one or more cameras. Determining, based on the received remote sensing data, that one or more portions of the first geographic region are associated with a particular agricultural characteristic may include analyzing the one or more color images of the first geographic region to determine whether the one or more color images indicate an existence or value of a particular agricultural characteristic. The particular agricultural characteristic is an indication of agricultural stress. Analyzing the one or more color images of the first geographic region to determine whether the one or more color images indicate an existence or value of a particular agricultural characteristic may include analyzing the one or more color images of the first geographic region to determine whether the one or more color images include one or more indications of yellow vegetation. The one or more color images may include one or more high-resolution color images.

Determining whether the particular agricultural characteristic is produced by one or more biotic factors may include: providing geographic data, other than the received remote sensing data, that identifies the one or more portions of the first geographic region associated with the particular agricultural characteristic to an agronomic simulation model; and receiving an output from the agronomic simulation model that includes data indicating whether the particular agricultural characteristic associated with each of the one or more respective portions of the first geographic region is caused by one or more non-biotic factors. The actions of the method may include: based on a determination that the output from the agronomic simulation model indicates that the particular agricultural characteristic associated with each of the one or more respective portions of the first geographic region is not caused by one or more non-biotic factors, determining that the particular agricultural characteristic is caused by one or more biotic factors. The actions of the method may include: based on a determination that the output from the agronomic simulation model indicates that the particular agricultural characteristic associated with each of the one or more respective portions of the first geographic region is caused by one or more non-biotic factors, determining that the particular agricultural characteristic is not caused by one or more biotic factors.

The one or more remote sensing devices may include a camera. Each of the one or more remote sensing devices may be coupled to a respective plane, drone, or satellite. The remote sensing data may include infrared remote sensing data, thermal measurements, and/or aerially collected remote sensing data. Inferring one or more inputs to the agronomic simulation model may include adjusting one or more parameters of the agronomic simulation model to account for the one or more biotic factors. The biotic factors may include existence of fungi, insects, and/or weeds. The non-biotic factors may include soil pH, soil nitrogen levels, soil consistency, soil depth, rainfall, phosphorus levels, and/or elevation.

Particular embodiments of the subject matter described in this specification can be implemented so as to realize one or more of the following advantages. Agronomic inputs to an agronomic simulation model can be improved using remote sensing techniques. An agronomic simulation model can be trained over time based on an analysis of received remote sensing data. Customized intervention plans can be created to reduce (e.g., minimize) waste. Agronomic output (e.g., crop yield) can be increased. Simulations can be performed using fewer computational resources. The accuracy of agronomic outputs predicted by the agronomic simulation model can be improved.

Details of one or more embodiments of the subject matter of this disclosure are set forth in the accompanying drawings and the description below. Other features, aspects, and advantages of the subject matter will become apparent from the description, the drawings, and the claims.

The foregoing Summary, including the description of some embodiments, motivations therefor, and/or advantages thereof, is intended to assist the reader in understanding the present disclosure, and does not in any way limit the scope of any of the claims.

BRIEF DESCRIPTION OF THE DRAWINGS

Certain advantages of some embodiments may be understood by referring to the following description taken in conjunction with the accompanying drawings. In the drawings, like reference characters generally refer to the same parts throughout the different views. Also, the drawings are not necessarily to scale, emphasis instead generally being placed upon illustrating principles of some embodiments of the invention.

DETAILED DESCRIPTION

Figure 1A:
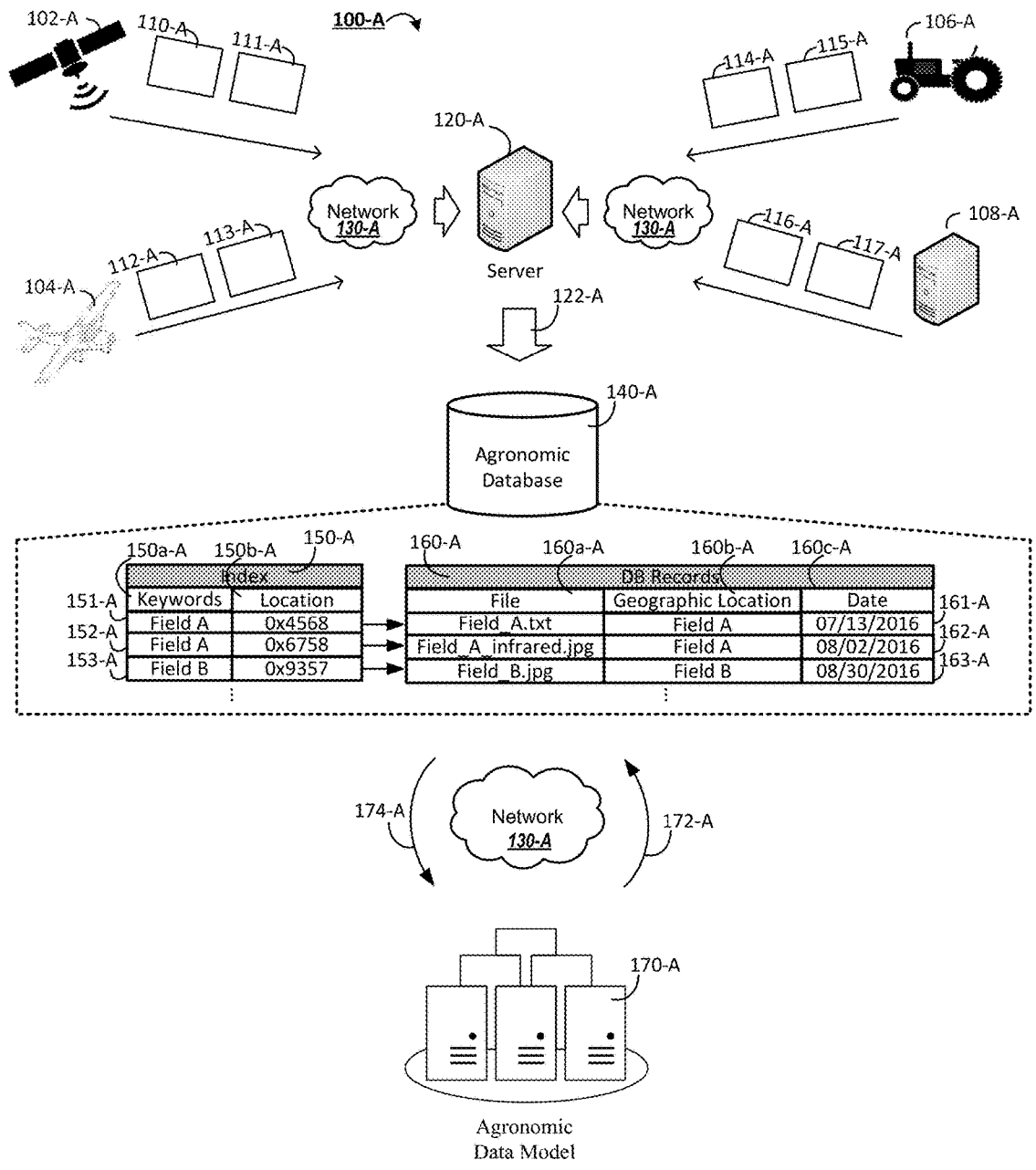
FIG. 1A is a diagram of an example of a system for obtaining agronomic data.

The following terms may be used in the detailed description:

As used herein, a "remote sensing device" may refer to a device that obtains information about a portion (or all) of the surface of the earth (or a geographic region) from a distance. Alternatively, or in addition, a "remote sensing device" may refer to a device that obtains information about a portion (or all) of the subsurface of the earth (or a geographic region) from a distance.

As used herein, "remote sensing data" refers to data obtained by one or more remote sensing devices.

As used herein, "agronomic parameters" may refer to one or more agricultural characteristics and/or environmental characteristics (e.g., of a geographic region, farmable zone, or candidate farmable zone).

As used herein, "agronomic simulation model" or "agronomic simulator" refers to a system that estimates and/or predicts an agronomic output based on one or more agronomic inputs.

As used herein, "agronomic input" or "input" refers to data (e.g., data characterizing agricultural characteristics, environmental characteristics, etc.) that can be provided as input to the agronomic simulation model. Agronomic inputs may characterize, for example, agronomic parameters.

As used herein, "agronomic output" or "output" refers to data that is output by an agronomic simulation model. Agronomic outputs may characterize the results of agronomic activity.

As used herein, a "geographic region" refers to a portion of the surface of the earth. Alternatively, or in addition, a "geographic region" may refer to a portion of the surface of any planet, asteroid, or other celestial body. Alternatively, or in addition, a geographic region may refer to a portion of the surface of an indoor greenhouse.

As used herein, an "agricultural characteristic" refers to one or more characteristics related to the production and/or use of plants (e.g., for food, feed, fiber, fuel, ornamentation, environmental or climatic modification, etc.). Agricultural characteristics may include, for example, cultivars and/or activities performed in the process of farming.

As used herein, a "set of agricultural characteristics" refers to a group of one or more agricultural characteristics.

As used herein, "environmental characteristics" may refer to one or more climate conditions, weather conditions, atmospheric conditions, and/or soil conditions (e.g., of a geographic region, farmable zone, or candidate farmable zone). "Weather conditions" may include, but are not limited to, precipitation (e.g., rainfall, snowfall, hail, or other types of precipitation), wind, and solar radiation. "Atmospheric conditions" may include, but are not limited to, carbon dioxide levels, ozone levels, and smog conditions. "Soil conditions" may include, but are not limited to, microbial presence, insect presence, weed presence, nematode presence, fungal organism presence, water table presence, location of water tables, and topography.

As used herein, "biotic factors" include "one or more living components that have an influence on the agricultural characteristics of a particular portion of, or all of, a geographic region." Alternatively, or in addition, "biotic factors" may include "once-living components that have an influence on the agricultural characteristics of a particular portion of, or all of, a geographic region."

As used herein, "non-biotic factors" include "one or more non-living components that have an influence on the agricultural characteristics of a particular portion of, or all of, a geographic region."

As used herein, "vegetation" refers to "one or more plants, algae, or mushrooms in a particular portion of a geographical region."

As used herein, "ponding" refers to "a collection of water in a particular portion of a geographical region.

As used herein, "canopy" refers to "a collection of the above ground portion of multiple plants formed by multiple plant crowns of a particular geographical region."

FIG. 1A is a diagram of an example of a system 100-A for obtaining agronomic data. The system 100-A may include at least one or more vehicles (e.g., a satellite 102-A, an airplane 104-A, or a tractor 106-A), at least one agronomic data providing server 108-A, a server 120-A, an agronomic database 140-A, and an agronomic data model 170-A.

Each of the vehicles may be equipped with one or more sensors capable of collecting agronomic data associated with a particular geographic region (e.g., a field of a farm). In some instances, the vehicles may include, for example, a satellite 102-A or an airplane 104-A equipped with one or more remote sensing devices for capturing image(s) of at least a portion of a geographic location. The images may include, for example, red-blue-green images, thermal images, infrared images, radar images, etc. Alternatively, or in addition, the vehicles may include a tractor 106-A equipped with one or more sensors capable of collecting agronomic data related to a particular portion of a geographic location that includes, for example, a plant's location (e.g., GPS location), the plant's weight, the plant's time of harvest, etc. Other types of vehicles may also be used to collect agronomic data associated with a particular portion of a geographic location. Such vehicles may include, for example, a drone. The agronomic data 110-A, 111-A, 112A, 113-A, 114-A, and 115-A captured by the vehicles may be transmitted via a network 130-A to a server 120-A. The network 130-A may include one or multiple networks, for example, a LAN, a WAN, a cellular network, the Internet, etc.

Alternatively, or in addition, agronomic data 116-A and 117-A may be obtained from one or more agronomic data providing servers 108-A. The server 108-A may, for example, house a database of historic agronomic data items from one or more geographic locations. For instance, the server 108-A may provide access to a database (e.g., a database hosted by a government agency, university, etc.) that tracks changes in agronomic data associated with particular geographic locations over time. The agronomic data 116-A, 117-A may be obtained from the server 108-A via a network 130-A.

Server 120-A may process the data 110-A, 111-A, 112-A, 113-A, 114-A, 115-A, 116-A, 117-A received via network 130-A and store 122-A the received data in an agronomic database 140-A. Processing the received data 110-A-117-A by server 120-A may include extracting relevant aspects of the received data for storage. Alternatively, or in addition, processing of the received data 110-A-117-A by server 120-A may include generating an index 150-A that can be used to efficiently access and retrieve the data 110-A-117-A once the data 110-A-117-A are stored as records 160-A in the agronomic database 140-A. The agronomic database 140-A may be hosted on the server 120-A. Alternatively, or in addition, the agronomic database may be hosted by one or more other servers.

The index 150-A may include one or more fields for each index entry 151-A, 152-A, 153-A, etc. Examples of index fields may include, for example, a keyword field 150a-A, a storage location field 150b-A, etc. In the example of system 100-A, the agronomic database 140-A may be configured to receive one or more search parameters for one or more database records (for example, search parameters requesting data related to "Field A"). In response to the receipt of such search parameters, the agronomic database 140-A may identify all the index entries matching the search parameter, identify the storage location 150b-A associated with each matching index entry, and access the database record(s) stored at the identified storage location(s). Though a particular example of an index 150-A and index fields 150a-A, 150b-A are provided herein, the present disclosure need not be so limited. Instead, any type of index may be used to index the data 110-A-117-A received and stored in the agronomic database 140-A so long as the data stored in the agronomic database 140-A can be accessed by the agronomic data model 170-A.

The data 110-A-117-A may be stored in the agronomic database 140-A as one or more database records 160-A. The agronomic database 140-A may store records in any logical database form (for example, a relational database, hierarchical database, column database, etc.). Instead of requiring the use of a particular logical database schema, the agronomic database 140-A may only require a configuration that allows the agronomic data stored by the agronomic database 140-A to be accessed by the agronomic data model 170-A. Some examples of the types of data that may be stored in agronomic database 140-A include a file 160a-A (e.g., an image file), a geographic location 160b-A associated with the stored file (or other agronomic data), a date 160c-A the data were captured, or the like. Any suitable type of data may be stored, and in some embodiments the types of data stored are determined based on the type of received data 110-A-117-A.

One or more server computers may provide access to the agronomic data model 170-A. The agronomic data model 170-A may request 172-A data from the agronomic database 140-A via a network 130-A. The requested data may be data that can be used to analyze agronomic characteristics associated with a particular geographic location. Agronomic data responsive to the agronomic data model's 170-A request 172-A may be returned 174-A from the agronomic database 140-A to the agronomic data model 170-A via one or more networks 130-A. The agronomic data model 170-A may use the agronomic data returned 174-A from the agronomic database 140-A as an agronomic input to the model.

Figure 1B:
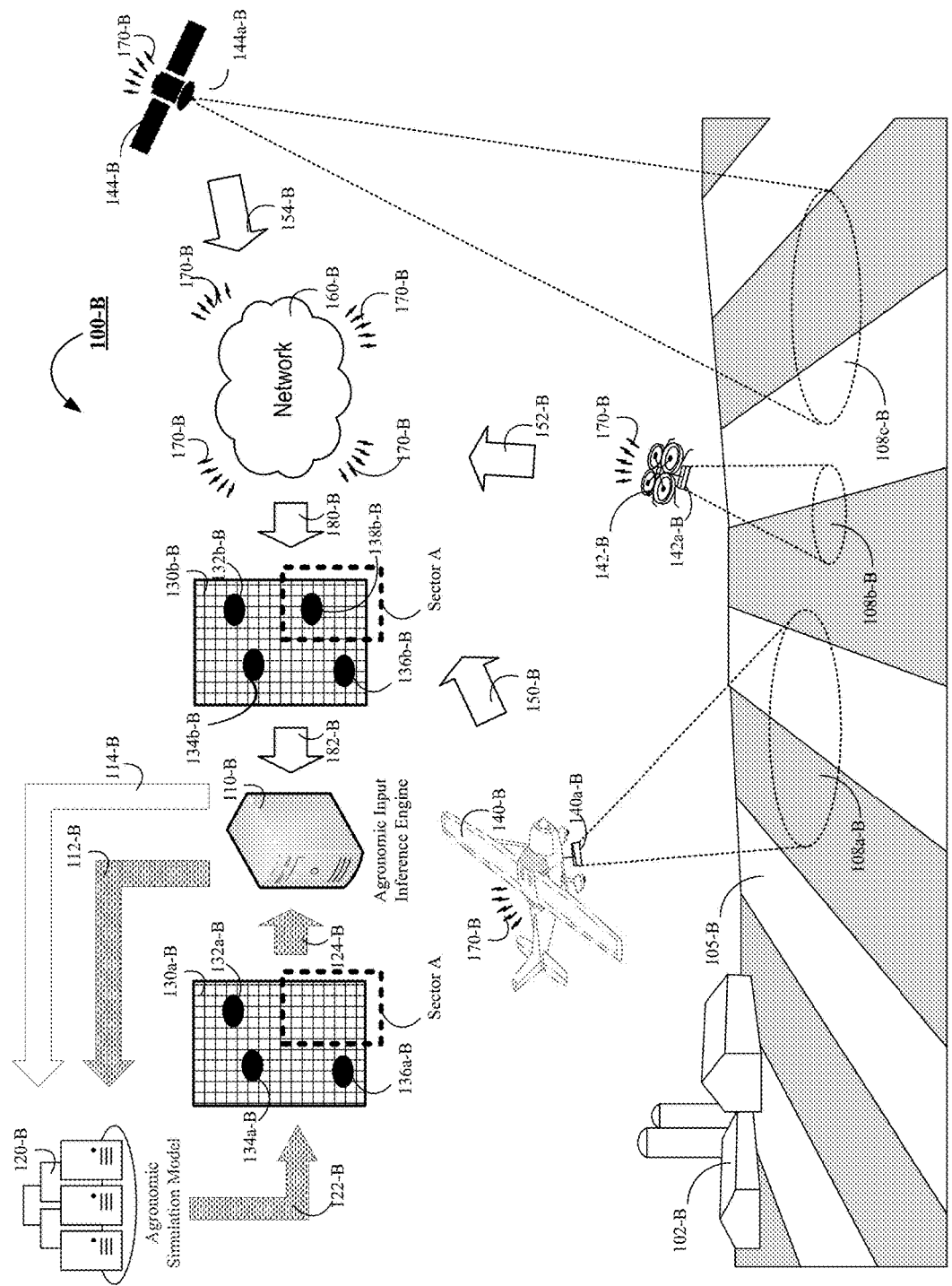
FIG. 1B is a contextual diagram of a system for using remote sensing data to infer inputs to an agronomic model.

FIG. 1B is a contextual diagram of a system 100-B for using remote sensing data to infer inputs to an agronomic model. In some embodiments, the system 100-B includes an agronomic input inference engine 110-B, an agronomic simulation model 120-B, multiple remote sensing devices 140a-B, 142a-B, 144a-B coupled to respective vehicles 140-B, 142-B, 144-B, and a network 160-B.

The system 100-B can be used to increase an agronomic output (e.g., crop yield) of a farm 102-B by analyzing one or more agricultural characteristics associated with each field of the farm 102-B. A field, e.g., field 105-B, is a geographic region associated with multiple different agricultural characteristics. The agronomic output (e.g., crop yield) of a particular field 105-B may be influenced by the agricultural characteristics of the field. Such agricultural characteristics may include, for example, rainfall, soil depth, soil pH, nitrogen levels, phosphorous levels, plant population, ponding, elevation, lateral runoff, existence of irrigation pipes, etc. Agricultural characteristics may include, for example, biotic factors and non-biotic factors. Biotic factors may include, for example, any living component that has an influence on the agricultural characteristics of a particular portion of a geographic region. Non-biotic factors may include, for example, any non-living component that has an influence on the agricultural characteristics of a particular portion of a geographic region.

In some instances, agricultural characteristics may be influenced by natural causes such as rainfall, elevation, lateral runoff, etc. In other instances, agricultural characteristics may be influenced by actions resulting from human interaction with a field (e.g., nitrogen levels, existence of irrigation pipes, etc.). Regardless of origin or type, agricultural characteristics can be analyzed using system 100-B to optimize crop yields for a particular field. In some instances, the existence or values of one or more agronomic parameters of a geographic region may be unknown, misinterpreted, etc., and the failure to provide accurate values of these parameters as inputs to an agronomic simulation model may have an adverse impact on the model's predictions of the geographic region's agronomic outputs (e.g., crop yield). Accordingly, the system 100-B facilitates a process for inferring the existence and/or values of agronomic inputs that can be used to improve the predictions made by the agronomic simulation model 120-B.

The agronomic input inference engine 110-B may interface with the agronomic simulation model 120-B. Interfacing with the agronomic simulation model 120-B includes, for example, the agronomic input inference engine 110-B providing 112-B an agronomic input to the agronomic simulation model 120-B and/or receiving 124-B an agronomic output from the agronomic simulation model 120-B. In some implementations, the agronomic input inference engine 110-B and the agronomic simulation model 120-B may be made up of one or more software units hosted, and executed by, the same computer, or group of computers. Alternatively, in other implementations, the agronomic input inference engine 110-B and the agronomic simulation model 120-B may be made of separate software units that are hosted by separate computers, or separate groups of computers. In those implementations where the agronomic interference engine 110-B and the agronomic simulation model 120-B are hosted by separate computers, or groups of computers, communications 112-B, 122-B, and 124-B may be facilitated through one or more networks (not shown in FIG. 1B) (e.g., a LAN, a WAN, a cellular network, the Internet, etc.).

The agronomic input provided 112-B to the agronomic simulation model 120-B may include a set of agronomic inputs associated with the field 105-B. The agronomic input 112-B may be obtained from a database of agricultural characteristics maintained by the agronomic input inference engine 110-B. In one implementation, the database of agricultural characteristics may include, for example, historical agricultural data that is specific to the field 105-B, geographic region where field 105-B is located, or both. For instance, the database of agricultural characteristics may include, for example, values of agronomic parameters (e.g., rainfall, soil depth, soil pH, nitrogen levels, phosphorous levels, plant population, ponding, elevation, etc.) that were measured from field 105-B at specific points in time in the past. The obtained agronomic input may then be provided 112-B to the agronomic simulation model 120-B to be processed. Some implementations of the agronomic simulation model 120-B is discussed in further detail in U.S. patent application Ser. No. 15/259,030, titled "Agronomic Database and Data Model" and filed on Sep. 7, 2016, the contents of which are hereby incorporated by reference herein to maximum extent permitted by applicable law.

The agronomic simulation model 120-B may predict a set of agronomic outputs and provide 122-B the predicted set of agronomic outputs to the agronomic inference engine 110-B. The agronomic simulation model 120-B may predict a set of agronomic outputs by performing multiple calculations in view of (e.g., based on and/or using) the received agronomic inputs. In some implementations, the agronomic simulation model 120-B may predict (e.g., calculate, or otherwise determine), for one or more agricultural characteristics in a set of agronomic inputs, whether the values of the first one or more agricultural characteristics included within the set of agronomic inputs imply (e.g., result in) the existence and/or value of a second agricultural characteristic included within the set of agronomic outputs. For example, the agronomic simulation model 120-B may predict (e.g., calculate) whether plants in a portion of a field will die given a predetermined amount of rainfall, soil composition, elevation, etc. In some implementations, the agronomic simulation model 120-B may facilitate back-calculating. Back-calculating may include, for example, the agronomic simulation model 120-B estimating the value of an agronomic output (e.g., the planting dates of one or more plants) by accessing known data that is indicative of a historical emergence dates of one or more plants, accessing data that is indicative of historical weather patterns that are associated with a geographic region, and using the historical emergence dates and historical weather data to back-calculate the value of the agronomic output of interest (e.g., the planting date of one or more plants in a particular geographic region). The emergence date may be, for example, the first date when a plant emerges from the ground after the seed associated with the plant is planted.

Alternatively, or in addition, a predicted set of agronomic outputs may include data indicative of the value, existence, non-existence, or level of existence of one or more agricultural characteristics. The existence, or non-existence, of one or more agricultural characteristic may be indicated in any suitable way, for example, via a predicted crop yield, existence of a canopy, a plant stand count, etc. Alternatively, or in addition, the existence, or non-existence, of one or more agricultural characteristics may be indicated via a prediction indicating a particular portion of a field is associated with a threshold amount of agricultural stress. A particular portion of a field may be associated with more than a threshold amount of agricultural stress if the agronomic simulation model indicates that certain crops are likely to be killed by non-biotic factors such as frost, anoxia, heat, drought, lack of sufficient ponding, excessive rainfall, excessive ponding, nitrogen deficiency, soil pH levels, soil consistency, phosphorus levels, elevation, etc. In some implementations, the predicted set of agronomic outputs may be indicative of different levels of existence. For instance, a predicted set of agronomic outputs may be indicative of a level of existence (e.g., light, moderate, heavy, etc.) of a particular agricultural characteristic (e.g., canopy, etc.). Similarly, the predicted set of agronomic outputs may be indicative of, for example, a measure of soil hydraulic conductivity, pollination, tasseling, evapotranspiration, etc.

A predicted set of agronomic outputs may represent or result in a conceptual snapshot (e.g., image) 130a-B of the agricultural characteristics associated with a field 105-B. The conceptual snapshot 130a-B may provide one or more indications of the value, existence, non-existence, or level of existence of one or more agricultural characteristics 132a-B, 134a-B, 136a-B. Each respective indication of the value, existence, non-existence, or level of existence of an agricultural characteristic may be associated with a location (e.g., a GPS location). The agronomic outputs may be provided in any suitable form (e.g., data in a text file, data in a database, data in a spreadsheet, or an image corresponding to a map of the field 105-B). For example, agronomic outputs may be provided in an image corresponding to a map of the field 105-B by coloring portions of an image of a map of field 105-B first and second colors (e.g., green or yellow) based on whether the model predicts that plants at each respective GPS location are predicted to live or predicted to die, respectively, given a particular set of agronomic inputs processed by agronomic simulation model 120-B.

For instance, if the agronomic output indicates that a plant at a particular GPS location is likely to survive, the corresponding portion of an image of a map of field 105-B may be colored green to indicate that the plant at that location is predicted to survive given the particular set of agronomic inputs processed by the agronomic simulation model 120-B. Alternatively, or in addition, if the agronomic output indicates that a plant at a particular GPS location is predicted to die, the corresponding portion of an image of a map of field 105-B may be colored yellow to indicate that the plant at that location is predicted to die given the particular set of agronomic inputs processed by the agronomic simulation model 120-B.

In the example of FIG. 1B, the conceptual snapshot 130a-B, generated from a specific set of historical agronomic input data provided 112-B by the agronomic input inference engine 110-B, indicates plants are predicted to die at locations corresponding to indications 132a-B, 134a-B, 136a-B. In addition, the conceptual snapshot 130a-B also indicates that the agronomic simulation model 120-B did not predict that any plants would die in sector A of the field 105-B. The conceptual snapshot 130a-B is received 124-B by the agronomic input inference engine 110-B.

Though the example of FIG. 1B describes a scenario where the indications 132a-B, 134a-B, 136a-B are indicative of the locations and existence of plants that are predicted to die, the present disclosure need not be limited to such indications. For instance, the indications 132a-B, 134a-B, 136a-B may be indicative of a certain level of ponding. Alternatively, the indications 132a-B, 134a-B, 136a-B may be indicative of a certain level of canopy growth. Alternatively, the indications 132a-B, 134a-B, 136a-B may be indicative of any agronomic output that can be predicted by the agronomic simulation model 120-B.

In some embodiments, the agronomic input inference engine 110-B can interface with one or more remote sensing devices 140a-B, 142a-B, 144a-B, which may be coupled to respective vehicles 140-B, 142-B, 144-B, to obtain remote sensing data. For instance, a plane 140-B that is equipped with a remote sensing device 140a-B can fly over the field and use the remote sensing device 140a-B to capture one or more images of one or more portions 108a-B of the field 105-B. The one or more captured images may be transmitted 150-B to the agronomic input inference engine 110-B through the network 160-B using one or more wireless, or wired, communication links 170-B. The network 160-B may include one or more of a LAN, a WAN, a cellular network, the Internet, etc. The images may include any type of images including black-and-white images, color images on the red-blue-green spectrum, infrared images, near-infrared images, thermal images, radar images, images representing ultraviolet light and/or other forms of electromagnetic radiation, etc.

Any suitable type of vehicle equipped with a remote sensing device may be used to capture images of the field 105-B. For instance, a plane 140-B can be used to capture images of one or more portions 108a-B of the field 105-B (e.g., when a satellite is not available, or during times of heavy cloud cover). Alternatively, or in addition, a satellite 144-B may be used to capture images of one or more portions 108c-B of the field 105-B (e.g., when the satellite is overhead, when it is too windy for the plane 140-B to fly, or both. Alternatively, or in addition, one or more drones (e.g., unmanned aerial vehicles or "UAVs") 142-B may be used to capture images of one or more portions 108b-B of the field 105-B (e.g., when one or more portions of a field 105-B are not within a line of sight of either the plane 140-B or satellite 144-B). One or more drones 142-B may also prove useful, for example, in capturing images of a targeted portion 108b-B of the field 105-B. Images captured by one or more drones 142-B and/or the satellite 144-B may be transmitted 152-B, 154-B through the network 160-B in the same, or substantially similar manner, as images transmitted 150-B from the plane 140-B.

One or more of the images transmitted 150-B, 152-B, 154-B by a respective vehicle 140-B, 142-B, 144-B equipped with a remote sensing device 140a, 142a, 144a may be routed 180-B through the network 160. Referring to FIG. 1B, the image 130b-B is representative of at least one, or multiple, images captured by a remote sensing device 140a-B, 140b-B, 140c-B. The image 130b-B may provide one or more indications 132b-B, 134b-B, 136b-B, 138b-B of the existence, or non-existence, of one or more agricultural characteristics. The indications 132b-B, 134b-B, 136b-B, 138b-B may include, for example, pixels representing the existence of yellow plants indicating that the plants at the location of the field associated with the indications 132b-B, 134b-B, 136b-B, 138b-B are dying. In the example of FIG. 1B, the image 130b-B, generated based on images captured from one or more remote sensing devices 140a-B, 142a-B, 144a-B and received 180-B through the network 160-B, includes an indication 138b-B of the existence of yellow plants that are dying in sector A of the field 105-B. The image 130b-B is received 182-B by the agronomic input inference engine 110-B.

Though the example of FIG. 1B describes a scenario where the indications 132b-B, 134b-B, 136b-B, 138b-B are indicative of the existence of plants that are yellow and dying, the present disclosure is not limited to such indications. For instance, one or more of indications 132b-B, 134b-B, 136b-B, 138b-B may be indicative of a certain level of ponding. Alternatively, one or more of the indications 132b-B, 134b-B, 136b-B, 138b-B may be indicative of a certain level of canopy growth. Alternatively, one or more of the indications 132b-B, 134b-B, 136b-B, 138b-B may be indicative of any agronomic output that can be detected based on an output generated using a remote sensing device 140a-B, 142a-B, 144a-B.

The agronomic input inference engine 110-B may analyze the conceptual snapshot 130a-B that was generated based on the output of the agronomic simulation model 120-B and the image 130b-B that was generated based on the output of one or more remote sensing devices 140a-B, 142a-B, 144a-B. The conceptual snapshot 130a-B and the image 130b-B may be referred to as respective representations of the field 105-B. Analysis of the conceptual snapshot 130a-B and the image 130b-B may include, for example, comparing the conceptual snapshot 130a-B to the image 130b-B to determine whether any differences exist with respect to the agricultural characteristics detected within each respective representation of field 105-B, to characterize (e.g., qualitatively characterize) such differences, and/or quantify such differences. The comparison may include, for example, an image analysis of the conceptual snapshot 130a-B, the image 130b-B, or both to determine whether the conceptual snapshot 130a-B and the image 130b-B include the same, or a different, set of indications of agricultural characteristics. In one implementation, each indication of an agricultural characteristic identified in the image 130b-B may be compared to the indications of agricultural characteristics identified in the conceptual snapshot 130a-B. Data indicating the existence of a particular agricultural characteristic in the conceptual snapshot 130a-B may be confirmed if, for example, the features associated with a particular geographic characteristic in the image 130b-B match the features associated with a particular geographic characteristic in the conceptual snapshot 130a-B within a predetermined similarity threshold. The features associated with a particular geographic characteristic may include, for example, a GPS location and one or more agricultural characteristics associated with the GPS location.

In some implementations, a combination of data processing and image analysis techniques may be used to facilitate the comparison between the conceptual snapshot 130a-B and the image 130b-B. For instance, in some implementations, the conceptual snapshot 130a-B may include a spreadsheet, text file, etc. that identifies a set of one or more characteristics associated with a particular location (e.g., GPS location). In such instances, image files received from one or more remote sensing devices can be analyzed to detect the values, existence, or non-existence, of agricultural characteristics in a field 105-B, and the results of the image analysis can be compared with data extracted from the conceptual snapshot (e.g., from the spreadsheet, text file, etc.) to determine whether the conceptual snapshot 130a-B and the image 130b-B include the same, or a different, set of indications of agricultural characteristics.

In the example of FIG. 1B, the agronomic input inference engine 110-B can detect a discrepancy between the respective representations of field 105-B in Sector A. In particular, the agronomic input inference engine 110-B determines that the agronomic simulation model 120-B failed to predict that plants would die in Sector A as indicated in conceptual snapshot 130a-B, whereas the indication 138b-B in the image 130b-B generated based on the remotely sensed data indicates that plants died in Sector A.

The determination, based in part on the remotely sensed data, that the agronomic simulation model 120-B failed to accurately predict that plants in Sector A would die may indicate that the agronomic simulation model 120-B does not account for the agricultural characteristics that are causing plants to die in Sector A. In one instance, the agronomic simulation model 120-B may be trained to predict outputs using all known non-biotic factors. Thus, if it is determined, based in part on the remotely sensed data, that the death of certain plants in Sector A was not predicted by the agronomic simulation model 120-B, then it may be inferred that the death of the plants in Sector A was based on factors not accounted for by the agronomic simulation model 120-B (e.g., biotic factors). Accordingly, the inputs to the agronomic model can be adjusted 114-B to predict more accurate outcomes (e.g., crop yields) by accounting for the presence of biotic factors causing the death of plants in Sector A. For instance, inputs to the model can be provided to account for the presence of biotic factors including insects, weeds, fungi, etc.

Alternatively, or in addition, additional inputs can be provided to the model to address the presence of the biotic factors (or other agricultural characteristics detected based on remote sensing data). Such additional inputs may represent, for example, a predetermined amount of weed killer, a predetermined amount of insecticide, increased water, etc. Then, the agronomic simulation model 120-B can process the adjusted/supplemented set of agronomic inputs to improve the accuracy of the agronomic outputs predicted by the agronomic simulation model 120-B. Moreover, the agronomic simulation model can be used to determine an approach (e.g., intervention) to address the dead plants identified in Sector A (or other portions of the field 105-B) by iteratively varying the inputs to the model (e.g., the values of the inputs) and analyzing the outputs of the model to determine which inputs (e.g., input values) are predicted to yield improvement (e.g., greatest improvement) in the output of interest.

The number of times the simulation is iteratively run based on adjusted inputs may be significantly reduced as a result of the adjusted agronomic inputs inferred based on the remote sensing data. This reduction in simulation cycles reduces the amount of computational resources used to improve agronomic outputs (e.g., crop yields) via the agronomic simulation model 120-B. Once the agronomic simulation model 120-B has been configured to predict improved agronomic outputs (e.g., crop yields), the agronomic inputs provided to the agronomic simulation model 120-B that produced the improved agronomic outputs can be implemented in the real world on a corresponding field of a farm such as field 105-B to yield the improved agronomic outputs in the real world field. Thus, the inputs to the agronomic simulator can be implemented as inputs on a real-world farm to improve real-world agronomic outputs (e.g., crop yield) of the farm.

By way of example, the agronomic inference engine 110-B may infer inputs to the agronomic simulation model 120-B based on received remote sensing data. Then, the agronomic inference engine 110-B can adjust one or more agronomic inputs to the model to address the agricultural characteristics indicated by the received remote sensing data (for example, in Sector A). Next, the simulation can be iteratively run (using the adjusted agronomic inputs as initial inputs, and varying the inputs across iterations of the simulation) until the outputs provided by the model 120-B (e.g., for the portion of the field in Sector A) match the agricultural characteristics indicated by the received remote sensing data.

In other implementations, the indication 138b-B in Sector A may indicate the existence of other types of agricultural characteristics of field 105-B. For instance, the indication 138b-B of image 130b-B may indicate that there is ponding of water in Sector A, whereas the conceptual snapshot 130a-B is not predicting ponding in Sector A. Based on this determination, the inputs to the agronomic model can be adjusted 114-B to predict more accurate outcomes (e.g., crop yields) by accounting for the existence of ponding in Sector A.

Though benefits of the subject matter of the present disclosure are discussed with reference to increasing crop yield, other benefits may be achieved by using the methods, systems, and computer-readable medium disclosed by this specification. For instance, the system 100-B may be used to decrease environmental impact of vegetation, decrease risk in planting certain vegetation, etc. In some instances, benefits of the subject matter disclosure by this specification may be merely informational and not result in a transformation of farm. For instance, in some implementations, the system 100-B may be used to determine whether to underwrite an insurance policy. In other implementations, for example, the system 100-B may be used to assist a person in determining whether to buy a farm or not. Other uses and benefits of system 100-B also fall within the scope of the present disclosure.

Other implementations of the subject matter described in this specification may use remote sensing data to make specific calculations in a direct manner. For instance, in one implementation a digital elevation map of a geographic region may be obtained, weather history for the geographic region may be obtained, and one or more remote sensing images may be obtained. The system may use one or more overhead remote sensing images to determine the bounds of a pond. In some instances, the system may use a DEM or a water shedding model to compute a volume of water in the pond. In some instances, the system may obtain rainfall data and kSAT data. In some instances, the system may determine what value of kSAT is necessary given the agricultural simulation model output provided with the known weather input to match the volume of standing water seen at in the remote sensing data at the time the remote sensing data was captured.

In some embodiments, determination of one or more agronomic characteristics may be made in an indirect manner. For instance, a patch of stand loss at a date/time T1 may be identified. In some implementations, DEM or a water shedding model and/or recent precipitation record (or other weather data) may be used to determine whether the patch of stand loss at T1 is likely due to ponding (e.g., because the patch is at a low point) and not some other characteristics (e.g., hail). In some implementations, a percentage of stand reduction can be inferred. In some instances, the model has an anoxia routine. In one example, assuming a complete stand or a particular value of stand loss at an initial date/time T0, the precipitation record and the saturated soil hydraulic conductivity ("kSAT") can be provided as inputs to the model, and the kSAT can be iteratively varied to determine what value of kSAT results in the observed amount of stand loss at T1.

Figure 2:
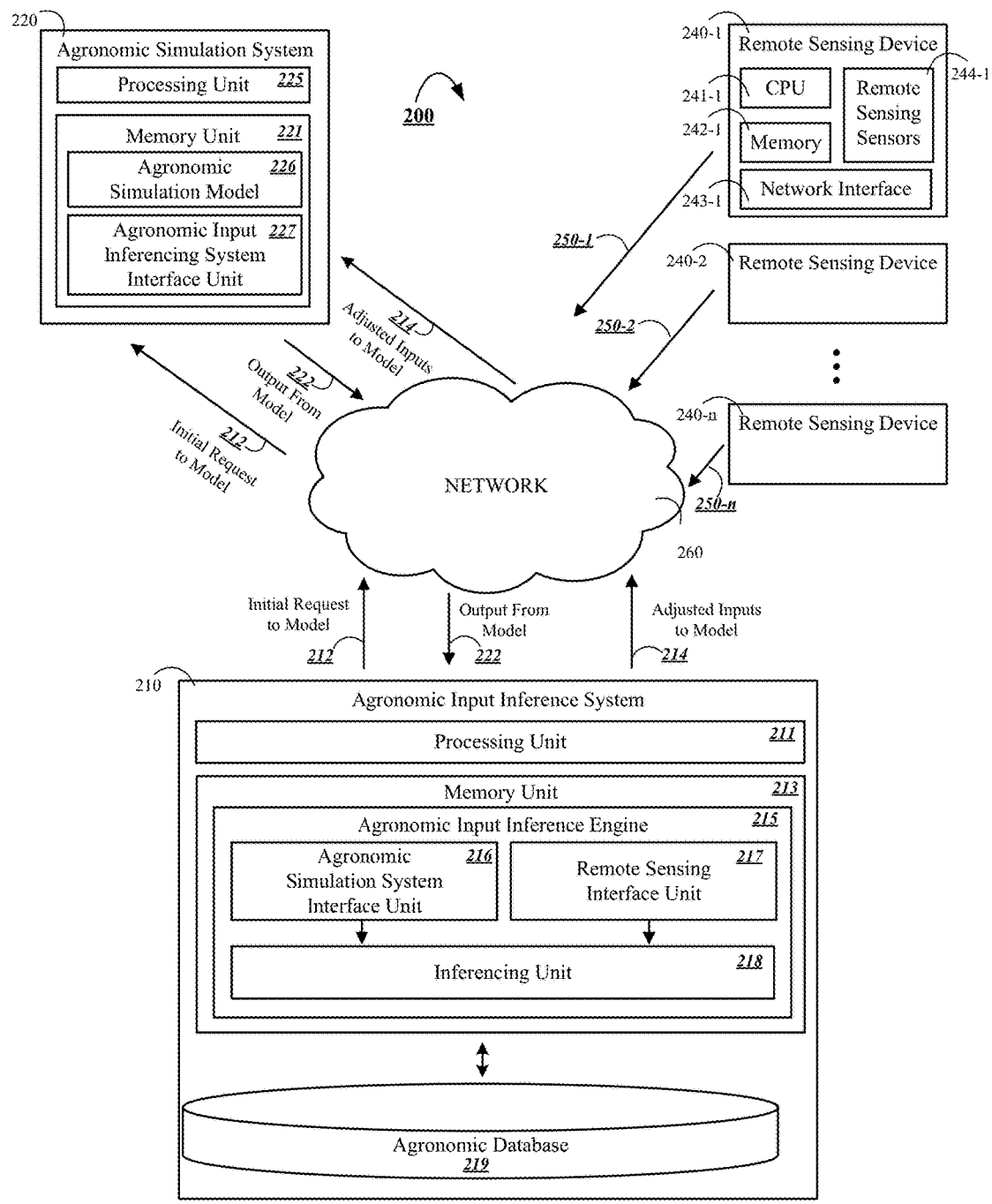
FIG. 2 is a block diagram of an example of a system for using remote sensing data to infer inputs to an agronomic model.

FIG. 2 is a block diagram of a system 200 for using remote sensing data to infer inputs to an agronomic model. The system may include an agronomic input inference system 210, an agronomic simulation system 220, one or more remote sensing devices 240-1, 240-2, 240-n, and a network 260.

The agronomic input inference system 210 may include one or more computers that each include at least a processing unit 211 and a memory unit 213. The processing unit 211 includes one or more processors configured to execute the instructions associated with each of one or more software modules stored in the memory unit 213. The memory unit 213 includes one or more storage devices (e.g., RAM, flash memory, storage disks, etc.) The memory unit 213 stores software modules used to perform the actions of methods of the agronomic input inference engine described by this specification. In particular, the software modules stored by the memory unit 213 may include a module implementing an agronomic input interference engine 215 that may be configured to perform the actions of methods as described with respect to FIGS. 1, 3, and 4. The agronomic input inference engine 215 may include an agronomic simulation system interface unit 216, a remote sensing interface unit 217, and an inferencing unit 218. In addition, the agronomic input inference system 210 includes an agronomic database 219. The agronomic database 219 stores agronomic data (e.g., property specific agronomic inputs) based on historical agricultural characteristics associated with one or more fields, one or more geographic regions, etc.

The agronomic simulation system interface unit 216 may facilitate networked communication between the agronomic input inference system 210 and the agronomic simulation system 220. For example, the agronomic simulation system interface unit 216 may function as a network interface that can transmit initial requests 212 to the agronomic simulation system 220. The initial requests 212 may include, for example, a set of property specific agronomic inputs that were obtained from the agronomic database 219. In some embodiments, the agronomic simulation system interface unit 216 is configured to receive communications from the agronomic simulation system 220 that include agronomic outputs 222. The agronomic outputs 222 may include, for example, a set of agronomic predictions related to a particular field, geographic region, etc. based on the agronomic simulation system's 220 processing of a received agronomic input transmitted in the initial request 212. In some embodiments, the agronomic simulation system interface unit 216 is configured to provide a received output 222 from the agronomic simulation system 210 to the agronomic input inference system's 210 inferencing unit 218.

The remote sensing interface unit 217 may facilitate networked communication between the agronomic input inference system 210 and one or more remote sensing devices 240-1, 240-2, 240-n, where "n" is any positive, non-zero integer. For example, the remote sensing unit 217 may function as a network interface that can receive one or more images 250-1, 250-2, 250-n transmitted by one or more respective remote sensing devices 240-1, 240-2, 240-n. The images may be representative of the output of one or more sensors of respective remote sensing devices. The images may include any type of images including black-and-white images, color images on the red-blue-green spectrum, infrared images, near-infrared images, thermal images, radar images, images representing ultraviolet light and/or other forms of electromagnetic radiation, etc. In some embodiments, the remote sensing interface unit 217 is configured to provide one or more images 250-1, 250-2, 250-n to the agronomic input inference system's 210 inferencing unit 218.

The inferencing unit 218 may analyze an agronomic output 222 from the agronomic simulation system 220 in view of one or more images 250-1, 250-2, 250-n received from one or more remote sensing devices 240-1, 240-2, 240-n, respectively. For example, the inferencing unit 218 may compare agricultural characteristics identified in the agronomic output 222 generated by agronomic simulation system's 220 processing of an agronomic input to agricultural characteristics indicated by one or more images 250-1, 250-2, 250-n obtained from respective remote sensing devices 240-1, 240-2, 240-n. The comparison may result in the determination that (1) the agricultural characteristics predicted by the agronomic simulation system 220 and the agricultural characteristics shown in remotely sensed images are the same (e.g., within a similarity threshold), (2) the agronomic simulation system 220 predicted the existence of agricultural characteristics that are not shown in a remotely sensed image, (3) the remotely sensed images show agricultural characteristics that were not predicted by the agricultural simulation system 220, or (4) a combination thereof.

Based on the comparison, the inferencing unit 218 may generate and transmit one or more adjusted inputs 214 to the agronomic simulation system 220. The adjusted inputs 214 can be provided to the agronomic simulation system 220, for example, to train the agronomic simulation model 226 based on the agricultural characteristics identified in a remotely sensed image. Training the agronomic simulation model 226 may include, for example, adjusting one or more parameters associated with an agronomic simulation model 226, altering one or more inputs provided to an agronomic simulation model 226, etc.

The agronomic simulation system 220 may include one or more computers that each include at least a processing unit 225 and a memory unit 221. The processing unit 225 includes one or more processors configured to execute the instructions associated with each of one or more software modules stored in the memory unit 221. The memory unit 221 includes one or more storage devices (e.g., RAM, flash memory, storage disks, etc.). The memory unit 221 stores software modules used to perform the actions of methods of the agronomic simulation model 120-B described by this specification. In particular, the software modules stored by the memory unit 221 may include modules implementing an agronomic simulation model 226 and/or an agronomic input inferencing system interface unit 227. In some implementations, the agronomic simulation system 220 may also include an agronomic database similar to agronomic database 219 stored by the agronomic input inference system 210. Alternatively, in one implementation, the agronomic simulation system 220 may host the agronomic database 219 and make the agronomic database 219 accessible to the agronomic input inference system 210. The agronomic input inference system interface unit 227 may facilitate networked communication between the agronomic simulation system 220 and the agronomic input inference system 210 via the network 260.

Though FIG. 2 depicts the agronomic simulation system 220 and the agronomic input inference system 210 as being separate components of the system 200, the present disclosure need not be so limited. For instance, in one implementation, the agronomic simulation system 220 and the agronomic input inference system 210 may be hosted by the same computer, or same group of computers.

The system 200 may include one, or multiple, remote sensing devices 240-1, 240-2, 240-n, where "n" is equal to any positive, non-zero integer value. The remote sensing device 240-1 includes a processing unit 241-1, a memory unit 242-1, a network interface 243-1, and one or more remote sensing sensors 244-1. The processing unit 241-1 includes one or more processors configured to execute the instructions associated with each of one or more software modules stored in the memory unit 242-1. The memory unit 242-1 includes one or more storage devices (e.g., RAM, flash memory, storage disks, etc.). The memory unit 242-1 stores software modules used to operate the remote sensing device 240-1 including, for example, the operation of one or more remote sensing sensors 244-1. Operation of the remote sensing sensors 244-1 includes, for example, powering on the remote sensing sensor 244-1, aiming the remote sensing sensor 244-1, focusing the remote sensing sensor 244-1, capturing one or more images using a remote sensing sensor 244-1, transmission of captured images using the network interface 243-1, etc. The remote sensing sensors 244-1 may include one or more of a digital camera, a thermal imaging device, an infrared imaging device, radar, ultraviolet imaging device, ground penetrating radar, representative sensors embedded into living plants, plants on the surface, rain gauges, soil probes, etc. In some implementations, the remote sensing sensors may include, for example, active sensing sensors (e.g., LIDAR or RADAR). The remote sensing device 240-1 may be configured to transmit one or more capture images 250-1 to the agronomic input inference system 210 via a network 260. Alternatively, captured images may be manually transferred from the remote sensing device 240-1 to the agronomic input system 210 using a removable storage device (e.g., a Universal Serial Bus (USB) storage device). Each of the one or more remote sensing devices 240-1, 240-2, 240-n can be mounted to a vehicle, for example, a plane, a drone, land-based rover, a satellite, a combine, etc.

Though the remote sensing devices described herein may include computer devices including a processor, memory, etc., a remote sensing device need not be so limited. For instance, a remote sensing device may include a chemical sensor that accumulates intercepted hydrogen ions and then turns a color. In such instances, the chemical sensor may itself be considered a remote sensing device that may be read by a remote camera. In a similar manner, other remote sensing devices may include a sticky bright paper and a pheromone to attract and count insects. Accordingly, remote sensing devices that do not include a processor, memory, or other electrical components also fall within the scope of the present disclosure.

Figure 3:
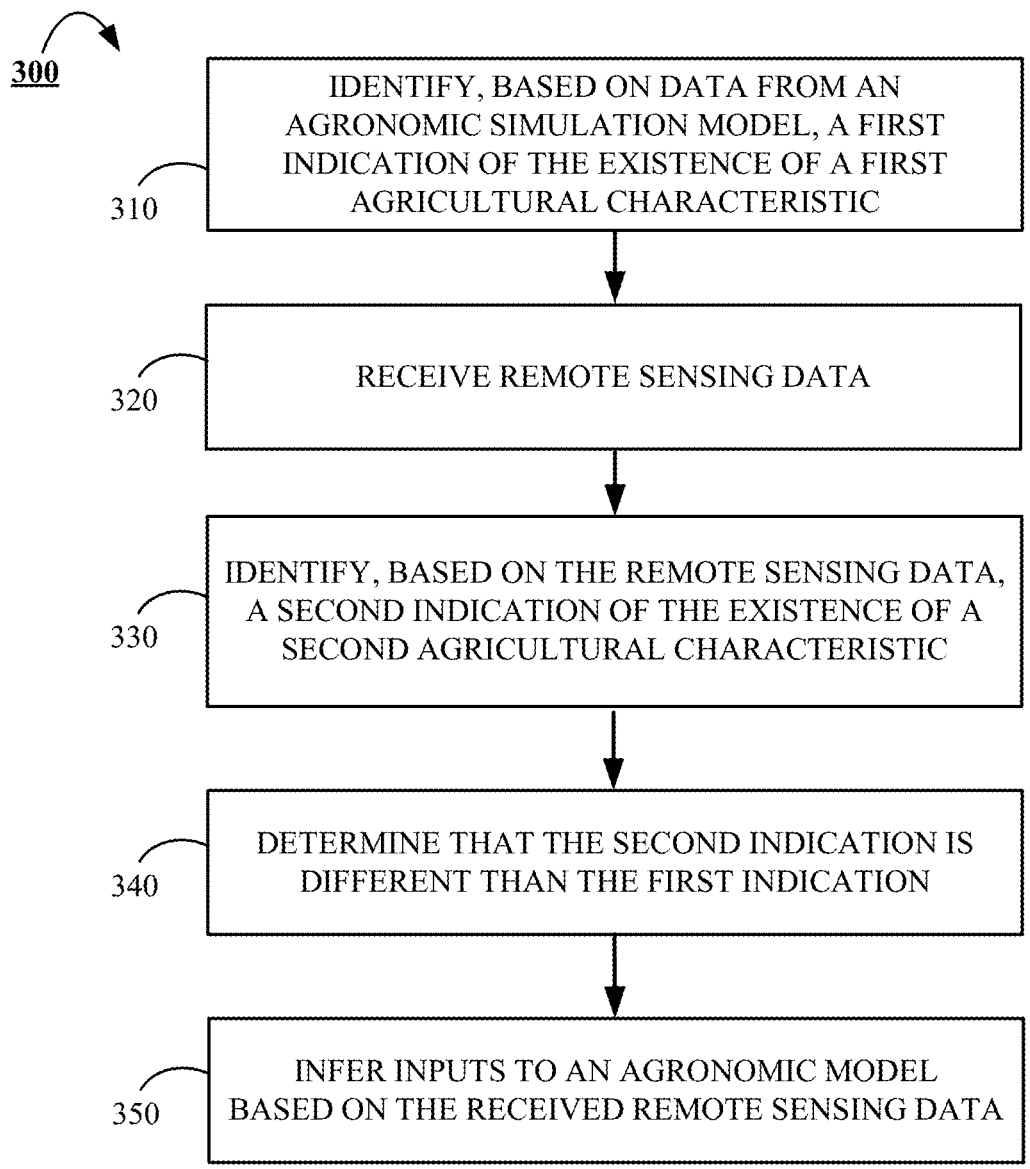
FIG. 3 is a flowchart of an example of a process for using remote sensing data to infer inputs to an agronomic model.

FIG. 3 is a flowchart of a process 300 for using remote sensing data to infer inputs to an agronomic model. For convenience, the process 300 is described as being performed by a system of one or more computers located in one or more locations. For example, a system 200 for inferring inputs to an agronomic simulation model 226, appropriately programmed in accordance with this specification, can perform the process 300.

The process 300 begins with the system identifying 310, based on data from an agronomic simulation model, a first indication of the value or existence of a first agricultural characteristic. The system may identify the first indication of the value or existence of a first agricultural characteristic by analyzing an agronomic output provided by an agronomic simulation model to detect the value or presence (or lack thereof) of one or more particular agricultural characteristics. The first indication of the value or existence of a first agricultural characteristic may include data that indicates that a particular agricultural characteristic exists or has a particular value at a particular location of a field or data that indicates that a particular agricultural characteristic does not exist at a particular location of a field. In one implementation, a first indication of the value or existence of a first agricultural characteristics may include, for example, the existence or non-existence of the ponding of water, dead plants, yellow plants, a canopy, pollination, evapotranspiration, tasseling, etc. Data indicating the value, existence, or non-existence, of a particular agricultural characteristic may include, for example, a GPS location and a vector that is representative of the one or more agricultural characteristics associated with the GPS location.

The system receives 320 remote sensing data from one or more remote sensing devices. The remote sensing data may include, for example, one or more images of a field captured by a remote sensing device mounted to a vehicle. The images may include any type of images including black-and-white images, color images on the red-blue-green spectrum, infrared images, near-infrared images, thermal images, radar images, images representing ultraviolet light and/or other forms of electromagnetic radiation, etc. The system can analyze the remote sensing data to identify 330 a second indication of the value or existence of a second agricultural characteristic. The second indication of the value or existence of a second agricultural characteristic may include data that indicates that a particular agricultural characteristic exists or has a particular value at a particular location of a field or data that indicates that a particular agricultural characteristic does not exist at a particular location of a field. In one implementation, a second indication of the existence of a second agricultural characteristic may include, for example, a determination that an image from a remote sensing device depicts ponding of water, dead plants, yellow plants, a canopy, pollination, evapotranspiration, tasseling, etc.

The system determines 340 whether the second indication is different than the first indication. Such a determination may include, for example, a comparative image analysis between the output of the agronomic simulator that yielded the first indication and one or more images obtained from one or more remote sensing devices. This determination allows the system 340 to confirm whether the actual image of the field captured by a remote sensing device confirms the existence, or non-existence, of the agricultural characteristics suggested by the first indication.

In response to determining that the second indication is different than the first indication, the system infers 350 a revised set of agronomic inputs to the agronomic simulation model based on the received remote sensing data to account for the value, existence, or non-existence, of the second agricultural characteristic as indicated by the second indication. For example, the inputs can be adjusted to indicate that remote sensing data shows that a particular portion of a field includes ponding, a canopy, tasseling, etc. Alternatively, the system may determine that the second indication is not different than the first indication. In response to determining that the second indication is not different than the first indication, the system may provide an input to the agronomic simulation model that reinforces the agronomic simulation model for making an accurate prediction.

Figure 4:
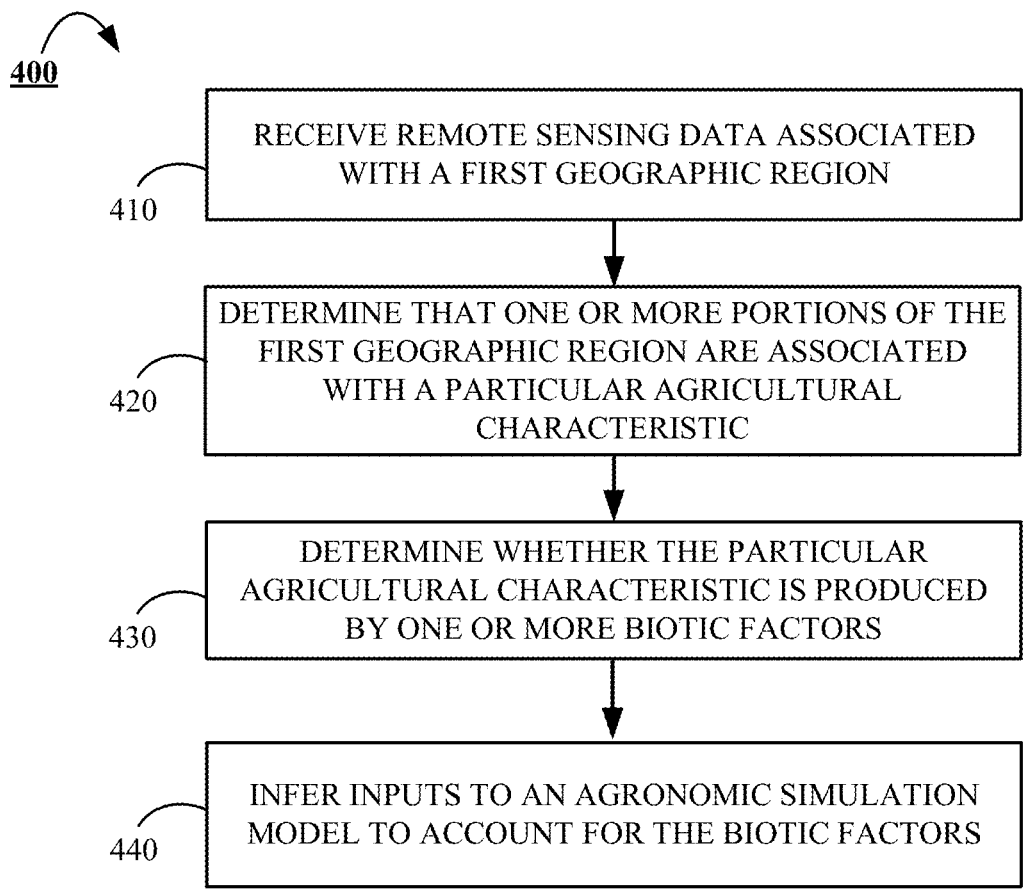
FIG. 4 is a flowchart of an example of a process for using remote sensing data to determine whether a detected agricultural characteristic of a geographic region is the result of biotic factors.

FIG. 4 is a flowchart of a process 400 for using remote sensing data to determine whether a detected agricultural characteristic of a geographic region is the result of (e.g., is explained by or depends on) biotic factors. For purposes of convenience (and without limitation), the process 400 is described as being performed by a system of one or more computers located in one or more locations. For example, a system 200 for inferring inputs to an agronomic simulation model 226, appropriately programmed in accordance with this specification, can perform the process 400.

The process 400 begins with the system receiving 410 remote sensing data associated with a first geographic region. The remote sensing data may include, for example, one or more images of a field captured by a remote sensing device mounted to a vehicle. The images may include any type of images including black-and-white images, color images on the red-blue-green spectrum, infrared images, near-infrared images, thermal images, radar images, images representing ultraviolet light and/or other forms of electromagnetic radiation, etc. The first geographic region may correspond to at least a portion of a field that is associated with a farm.

The system analyzes the remote sensing data received at stage 410 to determine 420 whether the remote sensing data indicates that one or more portions of the first geographic region are associated with a particular agricultural characteristic. The remote sensing data may include, for example, an indication that at least a portion of the first geographic region is under agricultural stress. An indication of agricultural stress may include, for example, the identification of one or more patches of yellow vegetation. In response to determining that the remote sensing data includes an indication that at least a portion of the first geographic region is associated with the particular agricultural characteristic, the system may determine 430 whether the particular agricultural characteristic is produced by one or more biotic factors. Biotic factors may include any living component having an influence on an agricultural characteristic of the first geographic location, for example, weeds, fungi, insects, etc.

Determining 430 whether the particular agricultural characteristic detected in the remote sensing data is produced by one or more biotic factors may include, for example, determining whether the particular agricultural characteristic detected in the remote sensing data is produced by one or more non-biotic factors. Non-biotic factors may include any non-living component that has an influence on an agricultural characteristic of the first geographic location, for example, soil nitrogen levels, soil pH, elevation, soil phosphorous levels, amount of sunlight, amount of rainfall, drought, or the like.

Determining 430 whether the particular agricultural characteristic is produced by one or more biotic factors may include, for example, interaction with an agronomic simulation model. For instance, the system may provide an agronomic input to an agronomic simulation model and request a set of agronomic output data predicted by the agronomic simulation model based on the agronomic input. In some implementations, the agronomic input may include, for example, data other than the remote sensing data received from the remote sensing devices. For instance, the agronomic input may include, for example, geographic data that identifies the one or more portions of the first geographic region that are associated with the particular agricultural characteristic identified at stage 420.

Determining 430 whether the particular agricultural characteristic is produced by one or more biotic factors may include receiving an agronomic output from the agronomic simulation model that is based on processing the agronomic input that includes the geographic data. The received agronomic output may include a predicted crop yield. Alternatively, or in addition, the agronomic output can indicate whether any of the multiple non-biotic factors accounted for by the agronomic simulation model predict the death of plants at the geographic location identified in the agronomic input. If the agronomic output indicates that plants at the geographic location identified in the agronomic input were predicted to die, then it can be concluded that the particular agricultural characteristic identified in the remotely sensed data is caused by non-biotic factors. If, on the other hand, the agronomic output indicates that plants at the geographic location identified in the agronomic input were predicted to live, then it can be concluded that the particular agricultural characteristic identified in the remotely sensed data is produced by biotic factors that are not accounted for by the agronomic simulation model.

In response to determining 440 that the particular agricultural characteristic identified in the remotely sensed data is produced by one or more biotic factors, the system may infer one or more inputs to the agronomic simulation model to account for the biotic factors. Inferring one or more inputs to account for the biotic factors may include, for example, adjusting the value associated with one or more input parameters of an agronomic simulation model to account for the existence of the biotic factors. For example, an agronomic input may be generated that includes the addition of a predetermined amount of fertilizer, insecticide, etc. that can be used to treat the biotic factors producing the particular geographical characteristic identified in the remotely sensed data.

In some implementations, the subject matter of the present disclosure may be used to generate a stability map. Generating a stability map may include, for example, analyzing the variance in the values corresponding to one or more agronomic characteristics across multiple neighborhoods N0 . . . Nm that each share at least one common boundary with another of the neighborhoods N0 . . . Nm. An "unstable region" may be a homogeneous region that may obscure some underlying heterogeneity. For instance, by way of example, two neighboring patches could both have high variance through time and thus both be marked "unstable" even though Patch A is high yielding in high precipitation years and low yielding in low precipitation years, while Patch B is high yielding in low precipitation years and low yielding in high precipitation years.

In some implementations, stability maps (e.g., zones) may be generated based on data obtained from one or more remote sensing devices. Such stability zones may be determined by, for example, determining the mean and the standard deviation through time of a series of inputs.

The inputs may include yield maps. Alternatively, or in addition, the inputs may be images from one or more remote sensing devices. Alternatively, or in addition, the system may mean-center each image to normalize it. Alternatively, or in addition, the system may determine the standard deviation of the pixels (e.g., normalized pixels) through time. In some implementations, ranges of the mean and ranges of the standard deviation may define the zones. For example, zones with standard deviation ≥a threshold value (e.g., 15) may be classified as "unstable," zones with standard deviation <the threshold value may be classified as "stable." Zones with means less than a first threshold (e.g., −10) may be classified as "low," zones with means greater than a second threshold (e.g., 10) may be classified as "high," and zones with means between the first and second thresholds may be classified as "medium." Using this classification scheme, six types of zones may be identified (e.g., unstable/low, unstable/medium, unstable/high, stable/low, stable/medium, and stable/high).

In some implementations, the remote sensing data may include, for example, normalized difference vegetation index (NDVI). NDVI may be collected multiple times over a predetermined time period (e.g., a month, multiple months, a year, etc.). One or more of these images at different times may be used to compute the maps. One or more of the images may be excluded from the set used to compute the maps. For instance, an image may be excluded if the image includes, for example, clouds. One or more functions may select which image(s) to use.

Such functions may, for example, perform one or more operations such as improving (e.g., maximizing) the amount of contrast of the image of the field. In some implementations, the functions may perform such operations only for pixels that represent plants. Alternatively, the function may instead be based on the growth stage of the plant. The model may be executed for the time period (e.g., year) on a periodic (e.g., daily) timestep to predict the plant growth stage for each period (e.g., day), and the predictions (e.g., predicted developmental stage) for a particular period (e.g., day) may be compared to the corresponding image(s) for that period (e.g., day), if any. An image may not exist for every period (e.g., day). In some implementations, the function for choosing the image to use may be based on trying to find the image closest to a given developmental stage of the crop, for instance V8 for corn, V6 for corn, or the like.

Alternatively, or in addition, elevation data may be used to analyze the agronomic characteristics of a particular geographic region. Elevation data may be analyzed using, for example, a high resolution Digital Elevation Model. The high resolution Digital Elevation Model may include a layer of surface height at every pixel. Alternatively, or in addition, the Digital Elevation Model may be based on irregular pixels or polygons. Alternatively, or in addition, other resolutions can be used.

Alternatively, or in addition, a water shedding model may be used to analyze agronomic characteristics of a particular geographic region. A water shedding model may include, for example, D-Infinity. In some implementations, the water shedding model may consider soil infiltration, evaporation, plant water use, etc. as the water moves to calculate the water flow along a field. Alternatively, or in addition, the water shedding model may account for lateral flow to calculate the water flow along a field. Alternatively, or in addition, the water shedding model may consider the effects of farm field drainage lines, waterways or streams in the model. Alternatively, or in addition, the water shedding model may consider areas outside the geographic region of interest draining to or from the geographic region under consideration. Alternatively, or in addition, the water shedding model may consider the different infiltration rates of water into the soil (and thus, e.g., decreasing the amount of runoff) of different soil zones across the geographic region (e.g., a sandier zone through which water filters faster, thus contributing less water flow runoff to other zones). Alternatively, or in addition, the water shedding model may consider the current saturation level of the soil in each of these zones to alter the amount of runoff (e.g., if a region is already saturated, more water runs off, and this is a quantitative effect over different levels of soil saturation). This may be computed from a soil hydrology model and the actual or simulated weather to date. Alternatively, or in addition, in determining the amount of runoff, the water shedding model may consider plant water uptake and evaporation. Alternatively, or in addition, the water shedding model may consider capillary action of soil drawing water up from below. The water shedding model may account for the "intensity" of the rain. The "intensity" of the rain may include, for example, the spacing of the rainfall in time. For example, if 2 cm of rain falls over only 2 minutes instead of over 2 hours, more runoff may occur as there is not enough time for as much water to intercalate into the soil. This may be, for example, actual spacing in time such as from hourly data or higher resolution in time RADAR or other measurement modalities, or it may be a proxy variable. For example, in the U.S., rainfall is generally more intense in the summer than in the winter.

In some implementations, the soil hydraulic conductivity (e.g., the rate that water can move through the soil) of each patch of soil can be used to calculate some amount of incident water absorbed and some amount of runoff. Alternatively, or in addition, the model could model some water coming up from capillary action, some water drawn up by plants, some water lost due to evaporation etc. During a precipitation event, each soil patch may be both receiving incoming precipitation and possibly contributing runoff to some of its neighbors.

In some implementations, a total amount of runoff may be transitively calculated for each pixel. Some amount of the incident rain may be absorbed by soil patch A, some amount may run off to soil patch B, and in some instances, another amount may run off into one or more other soil patches. Soil patch B may also have its own same incident rain, to which the runoff from Soil Patch A, and possibly other tiles, may be added. Some amount of this total may be absorbed into the soil at patch B, and some amount may run off to soil Patch C (and possibly others).

In some implementations, an "incident water mask" that accounts for the flow induced by topography can be calculated. The incident water mask may include a raster (e.g., a set of pixels that cover a geographic region (e.g., a farm field)) or vector (e.g., set of polygons that cover the geographic region (e.g., a farm field)) of weights, such that the Expectation (e.g., probability theory expectation such as the area-weighted mean) is 1. For example, if there exists R centimeters of rain on a geographic region (e.g., field), instead of assigning every zone of the geographic region (e.g., field) where the model is run to experience R cm of rain, the model can multiply that R cm by the corresponding water mask polygon's weight and use the resulting value as the rain for the model. For example, a geographic region (e.g., field) may have a depression in the center. Because the soil has some moisture and cannot absorb all of the incident rain at every point in space, some of the rain may run off of the soil surface and into the depression. This may result in the upper zone of the field experiencing only X<R cm of rain, and the depression experiencing Y>R cm of rain.

A static mask may be created to use for running the model. This static mask may be computed every hour and be used to simulate the entire soil hydrology system to supply soil moisture to the model.

Alternatively, or in addition, a much smaller series of masks may be computed in an effort to improve the computational efficiency of the above hourly process. For example, a mask could be computed for each month of the year. The mask, in at least one example, may correspond to one or more determinations of rainfall intensity. Alternatively, or in addition, the mask could be computed for each of the product of a series of aggregate initial soil moisture levels times the series of months of the year, thus taking into account 2 variables—e.g., the existing soil moisture (e.g., more initial moisture yields more runoff) and the rainfall intensity (e.g., greater intensity of rainfall yields more runoff). Alternatively, or in addition, the system can compute a single mask with an aggregate value of initial soil moisture (e.g., average soil moisture during the growing season) and an aggregate value of rainfall intensity (e.g., average value of rainfall intensity during the growing season). In any of these cases, the soil water content for each zone can be initialized, and then a rainfall event can be run in simulation using the specified rainfall intensity. The time to move runoff water between soil patches may occur in either continuous or discrete time. It may be assumed that this water transfer time is zero. Assuming the transfer time is zero can improve the computational efficiency of the process versus assuming steps in time.

In some implementations, all of the zones may be represented using a transition matrix. For example, each cell of the matrix may represent an amount of flow of water from a soil patch indicated by the row label of the matrix to the soil patch indicated by the column label of the matrix. When the row and column labels of a matrix cell are the same, that cell indicates the amount of water that will remain on the associated soil patch, and/or be absorbed into the soil. Such implementations may not be sensitive to the choice of flow direction from row patches to column patches. Alternatively, a flow may be expressed as from column patches to row patches. Alternatively, the flow may be represented as a weighted graph of soil patch nodes and edges with the transfer weight. In such an implementation, each row is normalized such that the values in the row sum to 1, meaning that the percentage of the water that flows to any of the other nodes or stays at the current node sums to 1, meaning that water is conserved (e.g., not created or destroyed). In this way the flow matrix may be a probability matrix. The matrix may be construed to represent a Markov chain, and the long term equilibrium state may be computed by, for example, being approximated by matrix exponentiation, solved using the inverse of the transition matrix, etc.

The generated mask (or masks), as it takes into account the different soil polygons/rasters for each farm field and thus the different soil hydrological processes (e.g., different intercalation rates), may be different for every field.

In some implementations, the system may construct a field specific water mask, collect precipitation data (and potentially other data) to run a crop model, multiply the mask by the precipitation data to create a modified per-zone incident rain value, use the modified value as input to the crop model, and predict one or more agronomic outputs based on the inputs to the crop model.

Further Description of Some Embodiments

Agronomic inputs can include both a type of agronomic input (e.g., sandiness) and a value for the agronomic input (e.g., 20%). In general, a change in an agronomic input refers to a change in the value for the agronomic input. Examples of agronomic inputs can include, but are not limited to: maximum ponding height; soil layer depth; saturated soil water content; soil bulk density; soil organic carbon content; soil clay content; soil sand content; soil silt content; soil stones (coarse fragment) content; lower limit of soil water availability; drained upper limit of soil water availability; saturated soil hydraulic conductivity; soil nitrogen content; soil pH; soil cation exchange capacity; soil calcium carbonate content; soil fresh organic matter (FOM) carbon, nitrogen and phosphorus content; soil active inorganic carbon content; soil slow inorganic carbon content; soil active inorganic phosphorus content; soil slow inorganic phosphorus content; soil mineral nitrogen including nitrate, ammonia and urea; air temperatures (including minimum and/or maximum); soil temperatures (including minimum and/or maximum); storm intensity (tightness of precipitation in time, for example, 1" over 5 hours or in 5 minutes); elevation; solar radiation; precipitation; relative humidity; planting date; planting window dates; temperate thresholds for planting; soil moisture thresholds for planting; crop row spacing; planting depth; crop species; crop variety/cultivar; yield components of the variety/cultivar (for example, beans per pod, pods per plant, kernels per ear, ears per plant, etc.); length of developmental stages of variety/cultivar; compression of developmental stages of variety/cultivar; planting density; field irrigation; irrigation event water volume; irrigation event dates; irrigation drain depth; irrigation drain spacing; fertilizer date; fertilizer amount; fertilizer type (for example, manure, anhydrous ammonia, etc.); chemical composition of fertilizer type; fertilizer application depth; fertilizer incorporation percentage; harvest date; percent of stalk/leaves knocked down at harvest; percent of plant by-product harvested (leaves, etc.); percent of grain/fiber/fruit/etc. harvested; insect activity; plant hypoxia; weed growth; disease.

Agronomic outputs can include both a type of agronomic output (e.g., crop yield) and a value for the agronomic output (e.g., 175 bushels/acre). In general, a change in an agronomic output refers to a change in the value for the agronomic output. Examples of agronomic outputs may include, but are not limited to, crop yield; sustainability; environmental impact; length of developmental stages of variety/cultivar; yield; leaf area index (LAI) over time; damage/death to the crop by frost, anoxia, heat, drought, etc.; dry weight of grains/fiber/fruit/veg; dry weight of shoots/areal plant parts; root depth; total root dry weight; change in biomass from previous time slice; daily and accumulated thermal time; radiation use efficiency; relative thermal time to maturity; current plant development phase; root weight, and of tillers; grain weight, and of tillers; total accumulated leaves or their equivalents; total accumulated phylochron intervals; leaf weight, and of tillers; weight of stem reserves, and of tillers; weight of stems, and of tillers; sink weight; source weight; below ground active organic nitrogen, carbon, phosphorus; below ground active inorganic nitrogen, carbon, phosphorus; atmospheric $CO_2$; below ground fertilizer nitrogen, carbon, phosphorus; carbon in cumulative $CO_2$ evolved; cumulative nitrogen fixed; cumulative harvested plant nitrogen and phosphorus; total nitrogen, carbon, phosphorus additions; below ground labile nitrogen and phosphorus; net nitrogen, carbon, phosphorus change; total nitrogen, carbon, phosphorus withdrawals; cumulative plant uptake of nitrogen and phosphorus; above ground rapid FOM nitrogen, carbon, phosphorus; below ground rapid FOM nitrogen, carbon, phosphorus; below ground resistant organic nitrogen, carbon, phosphorus; above ground interim FOM carbon; below ground interim FOM carbon; above ground slow FOM nitrogen, carbon; below ground slow FOM nitrogen, carbon; below ground slow organic nitrogen, carbon; below ground slow inorganic nitrogen, carbon; below ground solution nitrogen, phosphate; recognizable standing dead nitrogen, carbon, phosphorus; total nitrogen that can volatize; inorganic nitrogen in soil; cumulative nitrogen leached; organic nitrogen in soil; total nitrogen volatized; cold stress; drought; drought in stomatal conductivity; drought in turgidity; heat stress; nitrogen stress; phosphorus stress; photoperiod factor; cumulative drainage; potential cumulative evapotranspiration; potential evapotranspiration daily; cumulative plant transpiration; plant transpiration daily; cumulative soil evaporation; soil evaporation daily; cumulative evapotranspiration; evapotranspiration daily; cumulative irrigation; ponding height current; ponding height maximum; cumulative precipitation; cumulative runoff; potentially extractable water; and water table depth.

Agronomic inputs can be broken down by soil layer (e.g., by depth), over different time periods (for example, daily), and/or laterally (e.g., by location on a field). Lateral granularity can account for changes across a field or across multiple fields, such as changes in soil conditions, different crop/cultivar plantings in different locations on the same field, or other changes. For example, for every soil layer and for every time period agronomic outputs can also include, but are not limited to: new bulk density; downward water flux; net water flow; inorganic nitrogen in soil; root water uptake; dry weight of roots in the layer; soil temp; soil water content; soil hydraulic conductivity; upward water flux; active, slow, resistant organic carbon content's rapid, intermediate, and slow; total fresh organic matter content; soil carbon content; $CO_2$ sequestration; active, slow and resistant organic nitrogen contents; ammonia content; $N_2O$ content; nitrogen content; urea content.

The agronomic simulator simulates agronomic activity based on provided agronomic inputs. The agronomic activity can be simulated using an agronomic model, such as the SYSTEM APPROACH TO LAND USE SUSTAINABILITY (SALUS) model or the CERES model. The SALUS model can model continuous crop, soil, water, atmospheric, and nutrient conditions under different management strategies for multiple years. These strategies may have various crop rotations, planting dates, plant populations, irrigation and fertilizer applications, and tillage regimes. The model can simulate plant growth and soil conditions every day (during growing seasons and fallow periods) for any time period when weather sequences are available or assumed. The model can account for farming and management practices such as tillage and residues, water balance, soil organic matter, nitrogen and phosphorous dynamics, heat balance, plant growth, plant development, presence of biotech traits, application of fungicides, application of pesticides, application of antimicrobials, application of nucleic acids, and application of biologicals. The water balance can consider surface runoff, infiltration, surface evaporation, saturated and unsaturated soil water flow, drainage, root water uptake, soil evaporation and transpiration. The soil organic matter and nutrient model can simulate organic matter decomposition, nitrogen mineralization and formation of ammonium and nitrate, nitrogen immobilization, gaseous nitrogen losses, and three pools of phosphorous.

The agronomic simulator can use any process or model that can predict agronomic outputs based on provided agronomic inputs. For instance, the agronomic simulator can use a physical, generative or mechanistic model; a purely statistical or machine learning model; or a hybrid. In an example, the agronomic simulator can use a model that predicts agronomic outputs by attempting to match (by exact match or approximate match using, for instance, nearest neighbor) the provided agronomic inputs or a transformation or function thereof (e.g., a dimensionality reduction, such as Principle Components Analysis or the outputs of an Indian Buffet Process or other latent factor model) with a collection of previously observed inputs and their matching outputs, and predicting the output of the matched input.

In some examples, an agronomic simulator can use one or more non-analytic functions. An analytic function can be locally represented by a convergent power series; a non-analytic function cannot be locally represented by a convergent power series.

Further description of the agronomic simulator is provided in U.S. patent application Ser. No. 15/259,030, titled "Agronomic Database and Data Model" and filed on Sep. 7, 2016, the contents of which are hereby incorporated by reference herein to maximum extent permitted by applicable law.

In some examples, some or all of the processing described above can be carried out on a personal computing device, on one or more centralized computing devices, or via cloud-based processing by one or more servers. In some examples, some types of processing occur on one device and other types of processing occur on another device. In some examples, some or all of the data described above can be stored on a personal computing device, in data storage hosted on one or more centralized computing devices, or via cloud-based storage. In some examples, some data are stored in one location and other data are stored in another location. In some examples, quantum computing can be used. In some examples, functional programming languages can be used. In some examples, electrical memory, such as flash-based memory, can be used.

Figure 5:
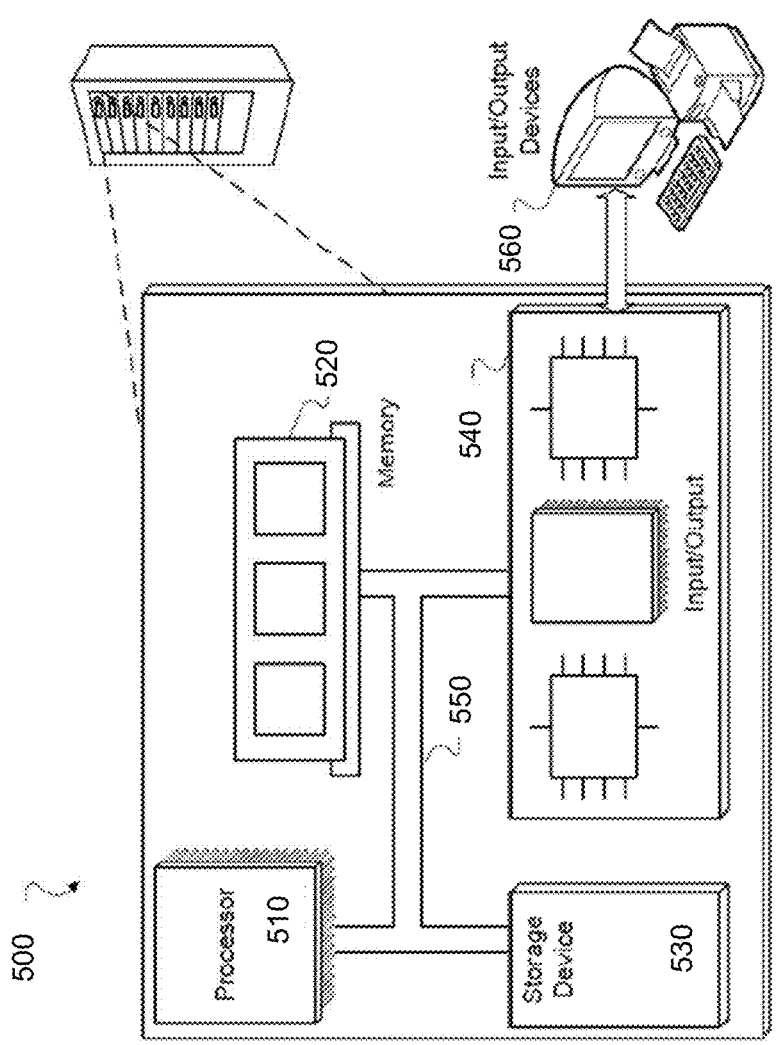
FIG. 5 is a diagram of a computer system.

FIG. 5 is a block diagram of an example computer system 500 that may be used in implementing the technology described in this document. General-purpose computers, network appliances, mobile devices, or other electronic systems may also include at least portions of the system 500. The system 500 includes a processor 510, a memory 520, a storage device 530, and an input/output device 540. Each of the components 510, 520, 530, and 540 may be interconnected, for example, using a system bus 550. The processor 510 is capable of processing instructions for execution within the system 500. In some implementations, the processor 510 is a single-threaded processor. In some implementations, the processor 510 is a multi-threaded processor. The processor 510 is capable of processing instructions stored in the memory 520 or on the storage device 530.

The memory 520 stores information within the system 500. In some implementations, the memory 520 is a non-transitory computer-readable medium. In some implementations, the memory 520 is a volatile memory unit. In some implementations, the memory 520 is a nonvolatile memory unit.

The storage device 530 is capable of providing mass storage for the system 500. In some implementations, the storage device 530 is a non-transitory computer-readable medium. In various different implementations, the storage device 530 may include, for example, a hard disk device, an optical disk device, a solid-date drive, a flash drive, or some other large capacity storage device. For example, the storage device may store long-term data (e.g., database data, file system data, etc.). The input/output device 540 provides input/output operations for the system 500. In some implementations, the input/output device 540 may include one or more of a network interface devices, e.g., an Ethernet card, a serial communication device, e.g., an RS-232 port, and/or a wireless interface device, e.g., an 802.11 card, a 3G wireless modem, or a 4G wireless modem. In some implementations, the input/output device may include driver devices configured to receive input data and send output data to other input/output devices, e.g., keyboard, printer and display devices 560. In some examples, mobile computing devices, mobile communication devices, and other devices may be used.

In some implementations, at least a portion of the approaches described above may be realized by instructions that upon execution cause one or more processing devices to carry out the processes and functions described above. Such instructions may include, for example, interpreted instructions such as script instructions, or executable code, or other instructions stored in a non-transitory computer readable medium. The storage device 530 may be implemented in a distributed way over a network, for example as a server farm or a set of widely distributed servers, or may be implemented in a single computing device.

Although an example processing system has been described in FIG. 5, embodiments of the subject matter, functional operations and processes described in this specification can be implemented in other types of digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible nonvolatile program carrier for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "system" may encompass all kinds of apparatus, devices, and machines for processing data, including by way of example a programmable processor, a computer, or multiple processors or computers. A processing system may include special purpose logic circuitry, e.g., an FPGA (field programmable gate array) or an ASIC (application specific integrated circuit). A processing system may include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program can include, by way of example, general or special purpose microprocessors or both, or any other kind of central processing unit. Generally, a central processing unit will receive instructions and data from a read-only memory or a random access memory or both. A computer generally includes a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps or stages may be provided, or steps or stages may be eliminated, from the described processes. Accordingly, other implementations are within the scope of the following claims.

Terminology

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of" will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

What is claimed is:

1. A method comprising:
   identifying, based on data from an agronomic simulation model, a first indication regarding existence of a first agricultural characteristic in a particular portion of a first geographic region;
   receiving one or more images of the first geographic region, the received images having been obtained using one or more remote sensing devices;
   identifying, based on the received images, a second indication regarding existence of the first agricultural characteristic in the particular portion of the first geographic region;
   determining that the second indication is distinct from the first indication;
   in response to determining that the second indication is distinct from the first indication, inferring one or more inputs to the agronomic simulation model based on the received images to account for the existence of the first agricultural characteristic as indicated by the second indication, and
   generating a first predicted value for crop yield in the first geographic region by executing the agronomic simulation model with the inferred inputs, wherein the first predicted value for the crop yield is more accurate than a second predicted value for the crop yield generated by executing the agronomic simulation model without the inferred inputs,
   wherein inferring one or more inputs to the model includes adjusting one or more parameters of the model and/or one or more agronomic inputs to the model to account for the existence of the first agricultural characteristic, and
   wherein adjusting the parameters of the model and/or the agronomic inputs to the model to account for the existence of the first agricultural characteristic includes iteratively adjusting the parameters and/or the agronomic inputs and executing the agronomic simulation model until output data provided by the model predict the existence of the first agricultural characteristic.

2. The method of claim 1, further comprising:
   identifying, based on second data from an agronomic simulation model, a third indication regarding existence of a second agricultural characteristic in a particular portion of a second geographic region;
   receiving remote sensing data associated with the second geographic region, the received remote sensing data having been obtained using one or more remote sensing devices;
   identifying, based on the received remote sensing data, a fourth indication regarding existence of the second agricultural characteristic in the particular portion of the second geographic region;
   determining that the fourth indication is substantially in accordance with the third indication; and
   based on determining that the fourth indication is substantially in accordance with the third indication, confirming a validity of the third indication regarding the existence of the second agricultural characteristic.

3. The method of claim 1, wherein the first agricultural characteristic includes pollination, evapotranspiration and/or tasseling.

4. The method of claim 1, wherein the images comprise images generated from infrared measurements, thermal measurements, visible light measurements, near-infrared measurements, measurements of ultraviolet light and other forms of electromagnetic radiation, and/or aerially collected remote sensing data.

5. The method of claim 1, wherein identifying, based on data from the agronomic simulation model, a first indication regarding the existence of a first agricultural characteristic in a particular portion of a first geographic region includes:
   providing geographic data, other than the received images, that identifies the particular portion of the first geographic region to an agronomic simulation model; and
   receiving an output from the agronomic simulation model that includes data identifying one or more agricultural characteristics that the agronomic simulation model predicts as existing within the particular portion of the first geographic region.

6. The method of claim 5, wherein the one or more agricultural characteristics are predicted by the agronomic simulation model based on an evaluation of rainfall, soil hydraulic conductivity, and elevation.

7. The method of claim 1, wherein receiving images associated with the first geographic region includes:
   receiving images of the first geographic region captured by one or more cameras.

8. The method of claim 7, wherein identifying, based on the received images, a second indication regarding the existence of the first agricultural characteristic in the particular portion of the first geographic region includes:
   analyzing the one or more images of the first geographic region to determine whether the one or more images include an indication of the existence of the first agricultural characteristic.

9. The method of claim 8, wherein the first agricultural characteristic includes ponding of water, tasseling and/or canopy growth.

10. The method of claim 1, wherein the one or more remote sensing devices include a camera coupled to a plane, drone, or satellite.

11. The method of claim 1, wherein the first agricultural characteristic includes ponding of water, dead plants, yellow plants, a canopy, pollination, evapotranspiration, and/or tasseling.

12. The method of claim 1, wherein determining that the second indication is distinct from the first indication includes determining that the second indication based on the images identifies at least one agronomic characteristic that is not modeled by the agronomic simulation model, and wherein the method further comprises updating the agronomic simulation model to model the identified at least one agronomic characteristic.

13. The method of claim 1, wherein the first indication regarding the existence of a first agricultural characteristic in a particular portion of a first geographic region includes data indicating the non-existence of the first agricultural characteristic, and wherein the second indication regarding the existence of the first agricultural characteristic in the particular portion of the first geographic region includes data indicating the existence of the first agricultural characteristic.

14. A method of using remote sensing data to infer one or more inputs to an agronomic simulation model, the method comprising:
receiving remote sensing data associated with a first geographic region, the received remote sensing data having been obtained using one or more remote sensing devices;
determining, based on the received remote sensing data, that one or more portions of the first geographic region are associated with a particular agricultural characteristic;
determining whether the particular agricultural characteristic is produced by one or more biotic factors;
in response to determining that the particular agricultural characteristic is produced by the one or more biotic factors, inferring one or more inputs to the agronomic simulation model to account for the one or more biotic factors; and
generating a first predicted value for crop yield in the first geographic region by executing the agronomic simulation model with the inferred inputs, wherein the first predicted value for the crop yield is more accurate than a second predicted value for the crop yield generated by executing the agronomic simulation model without the inferred inputs,
wherein inferring one or more inputs to the agronomic simulation model includes adjusting one or more parameters of the agronomic simulation model to account for the one or more biotic factors, and
wherein adjusting the parameters of the model to account for the biotic factors includes iteratively adjusting the parameters and executing the agronomic simulation model until output data provided by the model predict existence of the particular agricultural characteristic in the first geographic region.

15. The method of claim 14, further comprising:
for the particular agricultural characteristic, calculating, by the agronomic simulation model, another agricultural characteristic, with the particular agricultural characteristic being attributable to the other agricultural characteristic.

16. The method of claim 15, wherein calculating the other agricultural characteristic includes back-calculating the other agricultural characteristic.

17. The method of claim 15, wherein the particular agricultural characteristic comprises an emergence date and wherein the other agricultural characteristic comprises a planting date.

18. The method of claim 15, wherein the particular agricultural characteristic is indicative of ponding and wherein the other agricultural characteristic is indicative of soil hydraulic conductivity.

19. The method of claim 14, wherein the particular agricultural characteristic includes pollination, tasseling, evapotranspiration, a canopy, and/or a plant stand count.

20. The method of claim 14, wherein receiving remote sensing data associated with the first geographic region includes receiving data indicative of one or more color images of the first geographic region, the color images having been captured by one or more cameras, and
wherein determining, based on the received remote sensing data, that one or more portions of the first geographic region are associated with a particular agricultural characteristic includes analyzing the one or more color images of the first geographic region to determine whether the one or more color images indicate an existence or value of the particular agricultural characteristic.

21. The method of claim 20, wherein the particular agricultural characteristic is an indication of agricultural stress.

22. The method of claim 20, wherein analyzing the one or more color images of the first geographic region to determine whether the one or more color images indicate an existence or value of a particular agricultural characteristic includes:
analyzing the one or more color images of the first geographic region to determine whether the one or more color images include one or more indications of yellow vegetation.

23. The method of claim 14, wherein determining whether the particular agricultural characteristic is produced by one or more biotic factors includes:
providing geographic data, other than the received remote sensing data, that identifies the one or more portions of the first geographic region associated with the particular agricultural characteristic to an agronomic simulation model; and
receiving an output from the agronomic simulation model that includes data indicating whether the particular agricultural characteristic associated with each of the one or more respective portions of the first geographic region is caused by one or more non-biotic factors.

24. The method of claim 23, further comprising:
based on a determination that the output from the agronomic simulation model indicates that the particular agricultural characteristic associated with each of the one or more respective portions of the first geographic region is not caused by one or more non-biotic factors, determining that the particular agricultural characteristic is caused by one or more biotic factors.

25. The method of claim 23, further comprising:
based on a determination that the output from the agronomic simulation model indicates that the particular agricultural characteristic associated with each of the one or more respective portions of the first geographic region is caused by one or more non-biotic factors, determining that the particular agricultural characteristic is not caused by one or more biotic factors.

26. The method of claim 14, wherein the remote sensing data comprises infrared remote sensing data, thermal measurements, and/or aerially collected remote sensing data.

27. The method of claim 14, wherein the biotic factors include existence of fungi, insects, and/or weeds, and the non-biotic factors include soil pH, soil nitrogen levels, soil consistency, soil depth, rainfall, phosphorus levels, and/or elevation.

28. A system comprising:
one or more computers and one or more storage devices storing instructions that are operable, when executed by one or more computers, to cause the one or more computers to perform operations comprising:
identifying, based on data from an agronomic simulation model, a first indication regarding existence of a first agricultural characteristic in a particular portion of a first geographic region;
receiving one or more images of the first geographic region, the received images having been obtained using one or more remote sensing devices;

identifying, based on the received images, a second indication regarding existence of the first agricultural characteristic in the particular portion of the first geographic region;

determining that the second indication is distinct from the first indication;

in response to determining that the second indication is distinct from the first indication, inferring one or more inputs to the agronomic simulation model based on the received images to account for the existence of the first agricultural characteristic as indicated by the second indication; and generating a first predicted value for crop yield in the first geographic region by executing the agronomic simulation model with the inferred inputs, wherein the first predicted value for the crop yield is more accurate than a second predicted value for the crop yield generated by executing the agronomic simulation model without the inferred inputs, wherein inferring one or more inputs to the model includes adjusting one or more parameters of the model and/or one or more agronomic inputs to the model to account for the existence of the first agricultural characteristic, and wherein adjusting the parameters of the model and/or the agronomic inputs to the model to account for the existence of the first agricultural characteristic includes iteratively adjusting the parameters and/or the agronomic inputs and executing the agronomic simulation model until output data provided by the model predict the existence of the first agricultural characteristic.

29. A system comprising:

one or more computers and one or more storage devices storing instructions that are operable, when executed by one or more computers, to cause the one or more computers to perform operations comprising:

receiving remote sensing data associated with a first geographic region, the received remote sensing data having been obtained using one or more remote sensing devices;

determining, based on the received remote sensing data, that one or more portions of the first geographic region are associated with a particular agricultural characteristic;

determining whether the particular agricultural characteristic is produced by one or more biotic factors;

in response to determining that the particular agricultural characteristic is produced by the one or more biotic factors, inferring one or more inputs to the agronomic simulation model to account for the one or more biotic factors; and generating a first predicted value for crop yield in the first geographic region by executing the agronomic simulation model with the inferred inputs, wherein the first predicted value for the crop yield is more accurate than a second predicted value for the crop yield generated by executing the agronomic simulation model without the inferred inputs, wherein inferring one or more inputs to the agronomic simulation model includes adjusting one or more parameters of the agronomic simulation model to account for the one or more biotic factors, and wherein adjusting the parameters of the model to account for the biotic factors includes iteratively adjusting the parameters and executing the agronomic simulation model until output data provided by the model predict existence of the particular agricultural characteristic in the first geographic region.

* * * * *